United States Patent
Choi

(10) Patent No.: US 10,748,585 B2
(45) Date of Patent: Aug. 18, 2020

(54) CALIBRATION CIRCUIT INCLUDING COMMON NODE SHARED BY PULL-UP CALIBRATION PATH AND PULL-DOWN CALIBRATION PATH, AND SEMICONDUCTOR MEMORY DEVICE INCLUDING THE SAME

(71) Applicant: Samsung Electronics Co., Ltd., Suwon-si, Gyeonggi-do (KR)

(72) Inventor: Hun-Dae Choi, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/353,429

(22) Filed: Mar. 14, 2019

(65) Prior Publication Data

US 2020/0058332 A1 Feb. 20, 2020

(30) Foreign Application Priority Data

Aug. 16, 2018 (KR) .................. 10-2018-0095318

(51) Int. Cl.
*G11C 7/10* (2006.01)
*G11C 11/408* (2006.01)
*H03K 17/687* (2006.01)

(52) U.S. Cl.
CPC ........ *G11C 7/1048* (2013.01); *G11C 11/4087* (2013.01); *G11C 2207/2254* (2013.01); *H03K 17/6871* (2013.01)

(58) Field of Classification Search
None
See application file for complete search history.

(56) References Cited

U.S. PATENT DOCUMENTS

| | | | |
|---|---|---|---|
| 6,141,258 A | 10/2000 | Kawasumi | |
| 7,573,289 B2 | 8/2009 | Kim et al. | |
| 7,839,159 B2 | 11/2010 | Nakamura et al. | |
| 7,969,182 B2 | 6/2011 | Kim et al. | |
| 2007/0148796 A1 | 6/2007 | Nakamura et al. | |
| 2014/0266299 A1 | 9/2014 | Seol et al. | |
| 2017/0331476 A1* | 11/2017 | Cho | G11C 7/227 |
| 2017/0366183 A1* | 12/2017 | Jung | G11C 11/4074 |
| 2018/0158495 A1* | 6/2018 | Jeon | G11C 7/1057 |

FOREIGN PATENT DOCUMENTS

| | | |
|---|---|---|
| KR | 10-2007-0044790 A | 4/2007 |
| KR | 10-0820783 B1 | 4/2008 |
| KR | 10-0834330 B1 | 6/2008 |

(Continued)

*Primary Examiner* — Seokjin Kim
(74) *Attorney, Agent, or Firm* — Harness, Dickey & Pierce, P.L.C.

(57) ABSTRACT

A calibration circuit includes first and second pull-up units each receiving a pull-up code and connected between a pad connected with an external resistor and a first power supply voltage, a pull-down unit connected between the pad and a second power supply voltage and receiving a pull-down code, a comparator comparing a first voltage with a reference voltage and then compare a second voltage with the reference voltage, a first digital filter adjusting the pull-up code based on a first comparison result of the first voltage with the reference voltage, and a second digital filter adjusting the pull-down code based on a second comparison result of the second voltage with the reference voltage.

20 Claims, 14 Drawing Sheets

(56) References Cited

FOREIGN PATENT DOCUMENTS

| KR | 10-2010-0003602 A | 1/2010 |
|----|-------------------|--------|
| KR | 10-2010-002777 A  | 3/2010 |
| KR | 10-2010-0103146 A | 9/2010 |
| KR | 10-2011-0013704 A | 2/2011 |
| KR | 10-2011-0131708 A | 12/2011 |
| KR | 10-2014-0113782 A | 9/2014 |
| KR | 10-2017-0127169 A | 11/2017 |

* cited by examiner

CALIBRATION CIRCUIT INCLUDING COMMON NODE SHARED BY PULL-UP CALIBRATION PATH AND PULL-DOWN CALIBRATION PATH, AND SEMICONDUCTOR MEMORY DEVICE INCLUDING THE SAME

CROSS-REFERENCE TO RELATED APPLICATIONS

This U.S. non-provisional application claims the benefit of priority under 35 U.S.C. § 119 to Korean Patent Application No. 10-2018-0095318 filed on Aug. 16, 2018, in the Korean Intellectual Property Office, the disclosure of which is incorporated by reference herein in its entirety.

BACKGROUND

Various example embodiments of the inventive concepts described herein relate to a calibration circuit, a calibration system, a semiconductor memory device including the same, and/or a method of using a calibration circuit, and more particularly, relate to a calibration circuit including a common node shared by a pull-up calibration path and a pull-down calibration path, a semiconductor memory device including the same, a system including the same, and/or a method of using the calibration circuit.

A signal transmitted along a transmission line may be reflected at the end of the transmission line. Additionally, the signal reflection may have an influence on the transmission of the signal. A termination resistor may be used to match the impedance between devices exchanging signals through the transmission line, and may reduce the signal reflection. For impedance matching, a termination resistor (i.e., on-die termination (ODT)) may be included within a memory device which receives a command and an address from a memory controller at high speed, and exchanges data with the memory controller at high speed.

A value of the termination resistor (e.g., resistance value) in the memory device may vary with a process, a voltage, and a temperature. For this reason, the memory device may include a calibration circuit for calibrating the value of the termination resistor. A conventional calibration circuit includes a pull-up calibration path and a pull-down calibration path separated from each other. In this case, the respective paths may be influenced by the PVT (process, voltage, temperature) variation.

SUMMARY

Various example embodiments of the inventive concepts provide a calibration circuit including a common node shared by a pull-up calibration path and a pull-down calibration path, a system including the same, a semiconductor memory device including the same, and/or a method of using the same.

According to at least one example embodiment, a calibration circuit may include first and second pull-up units connected between a pad connected with an external resistor and a first power supply voltage, the first and second pull-up units each configured to receive a pull-up code, a pull-down unit connected between the pad and a second power supply voltage and configured to receive a pull-down code, a comparator configured to compare a first voltage and a reference voltage to generate a first comparison result, compare a second voltage and the reference voltage to generate a second comparison result, the first voltage generated based on the first pull-up unit and the external resistor, the first voltage generated at a common node connected to the pad, and the second voltage generated based on the first and second pull-up units, the external resistor, and the pull-down unit, the second voltage generated at the common node, a first digital filter configured to adjust the pull-up code based on the first comparison result, and a second digital filter configured to adjust the pull-down code based on the second comparison result.

According to at least one example embodiment, a semiconductor memory device may include a calibration circuit a calibration circuit configured to, adjust a first code, the adjusted first code causing a first resistance value of each of a plurality of first resistance units connected between a first pad and a first power supply voltage to be identical to a resistance value of an external resistor connected to the first pad, adjust a second code, the adjusted second code causing a second resistance value of a second resistance unit connected between the first pad and a second power supply voltage to be identical to the resistance value of the external resistor, generate a first result by comparing a first voltage and a reference voltage, generate a second result by comparing a second voltage and the reference voltage, the first voltage generated at a common node connected to the first pad based on one of the first resistance units and the external resistor, and the second voltage generated at the common node based on the first resistance units, the second resistance unit, and the external resistor, a memory cell array including dynamic random access memory (DRAM) cells connected to word lines and bit lines and configured to store data received or to be output through a second pad, a row decoder configured to select at least one of the word lines, a column decoder configured to select at least one of column selection lines connected with the bit lines, and an output driver configured to receive the first code and the second code, provide a termination resistance to the second pad based on the first code and the second code, and output the data stored in the memory cell array through the second pad.

According to at least one example embodiment, a semiconductor memory device may include a calibration circuit configured to operate based on a first power supply voltage and a second power supply voltage, adjust a first code and a second code using a resistance value of an external resistor connected to a first pad of the semiconductor memory device, generate a first result by comparing a first voltage and a reference voltage, the first voltage at a common node of the semiconductor memory device based on a first resistance value, the first resistance value based on the first code and the resistance value of the external resistor, the common node connected to the first pad, generate a second result by comparing a second voltage and the reference voltage, the second voltage at the common node based on a second resistance value, the second resistance value based on the first code, the resistance value of the external resistor, and a third resistance value based on the second code, an output driver configured to operate based on the first and second power supply voltages, receive the first and second codes, and adjust a value of a termination resistor connected to a second pad based on the first and second codes, a memory cell array including dynamic random access memory (DRAM) cells connected to word lines and bit lines, the memory cell array configured to operate based on a third power supply voltage and a fourth power supply voltage, and store data received or data to be output through the second pad, a row decoder configured to select at least one of the word lines, and a column decoder configured to select at least one of column selection lines connected with the bit lines.

DETAILED DESCRIPTION

Below, various example embodiments of the inventive concepts will be described in detail and clearly to such an extent that one of ordinary skill in the art could easily implement the example embodiments of the inventive concepts.

Figure 1:
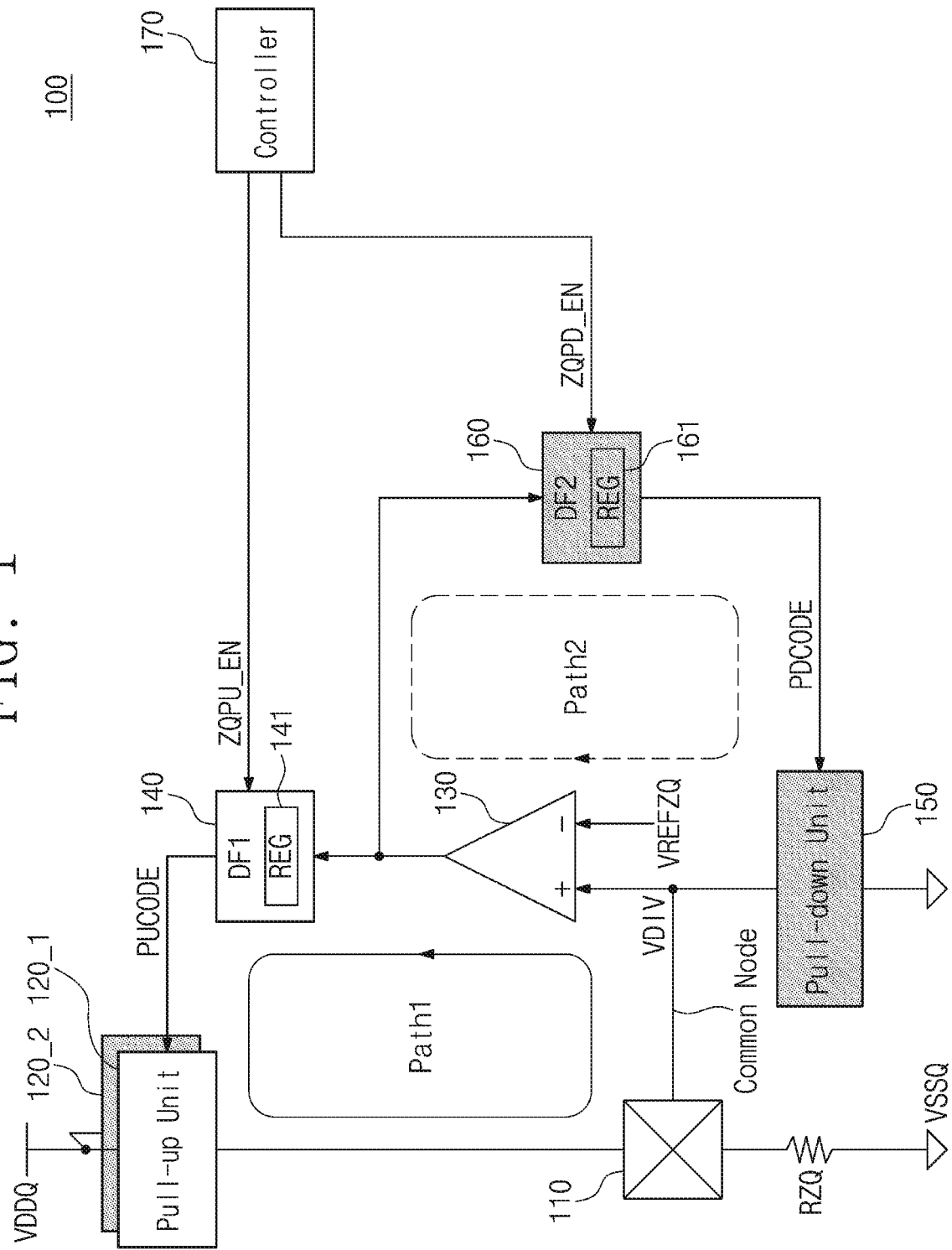
FIGS. 1 and 2 are block diagrams illustrating a calibration circuit according to at least one example embodiment of the inventive concepts.
Figure 2:
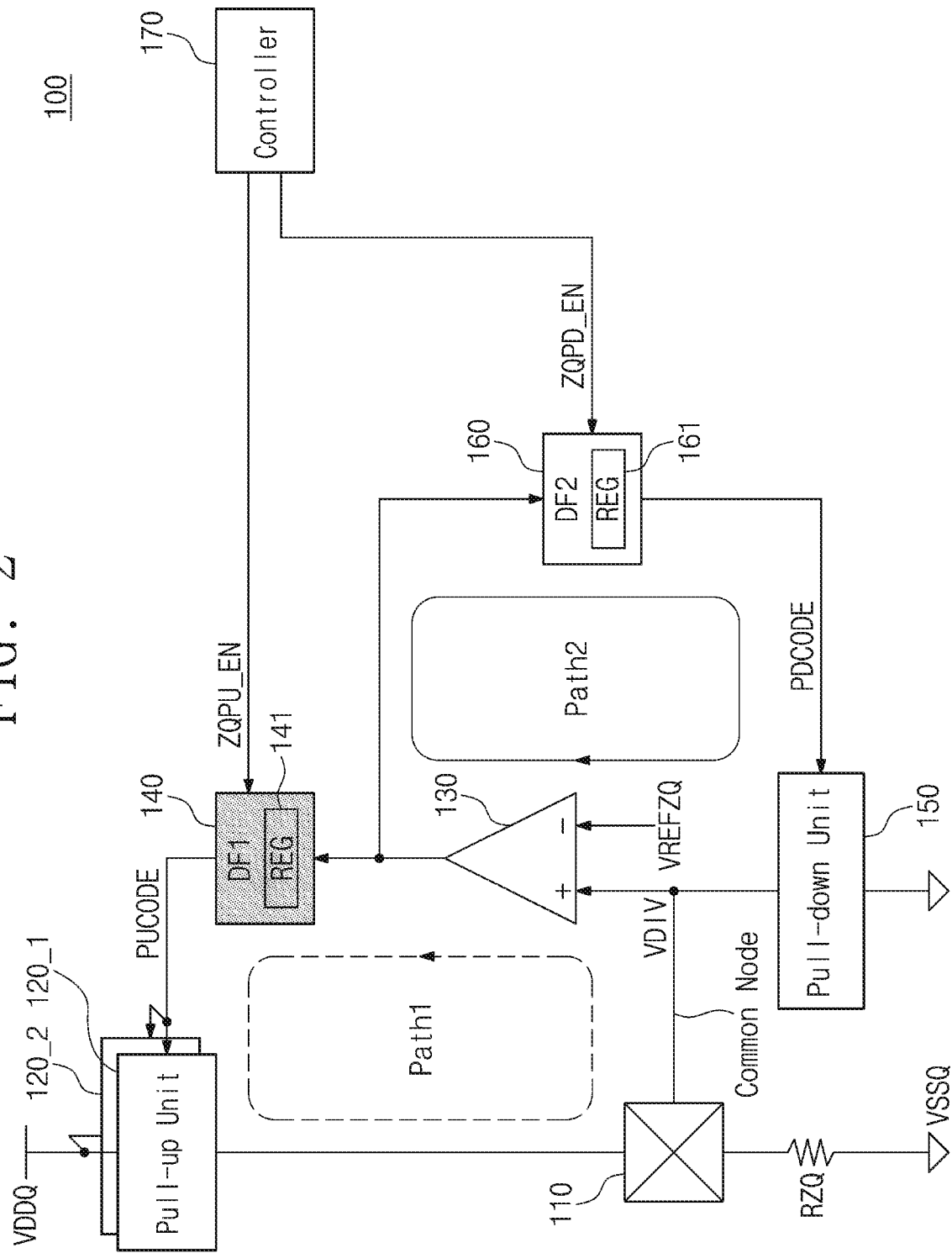

FIGS. 1 and 2 are block diagrams illustrating a calibration circuit according to at least one example embodiment of the inventive concepts. FIGS. 1 and 2 will be described together. A calibration circuit 100 may include a pad 110, pull-up units 120_1 and 120_2, a comparator 130, a first digital filter 140, a pull-down unit 150, a second digital filter 160, and/or a controller 170, etc., but is not limited thereto.

The pad 110 may be electrically connected with at least one external resistor RZQ. The external resistor RZQ may be connected between the pad 110 and a power supply voltage VSSQ, but may not be included in the calibration circuit 100. The external resistor RZQ may be a passive element which has no influence of the PVT variation of a semiconductor device in which the calibration circuit 100 is implemented. For example, the external resistor RZQ may have a resistance value of 240Ω, and a tolerance of +/−1% may be allowable with regard to the external resistor RZQ, but the example embodiments are not limited thereto.

The pull-up units 120_1 and 120_2 (e.g., pull-up transistors and/or pull-up resistors, etc.) may receive a pull-up code PUCODE respectively. The pull-up units 120_1 and 120_2 may be respectively connected between a power supply voltage VDDQ and the pad 110 connected with the external resistor RZQ depending on the pull-up code PUCODE. A resistance value of each of the pull-up units 120_1 and 120_2 may vary and/or may be changed depending on the pull-up code PUCODE. Each of the pull-up units 120_1 and 120_2 may be a variable resistance unit (e.g., variable resistor, etc.) or a pull-up resistance unit (e.g., pull-up resistor, etc.) having a variable resistance value depending on (and/or based on) the pull-up code PUCODE, but are not limited thereto. The pull-up units 120_1 and 120_2 may be implemented identically to each other, but are not limited thereto.

The comparator 130 may compare a voltage VDIV of a common node (or a pad node) with a reference voltage VREFZQ. For example, a first level of the voltage VDIV may be determined by voltage division which is made according to a (potential) difference between the power supply voltages VDDQ and VSSQ, the one pull-up unit 120_1, and the external resistor RZQ. For another example, a second level of the voltage VDIV may be determined by voltage division which is made according to the (potential) difference between the power supply voltages VDDQ and VSSQ, the two pull-up units 120_1 and 120_2, the pull-down unit 150, and/or the external resistor RZQ, etc. Both the first level and the second level may be generated at the common node electrically connected with the pad 110. In other words the first level and the second level may be located at and/or detected at the common node. The comparator 130 may include an amplifier which amplifies a level (or potential) difference of the voltage VDIV and the reference voltage VREFZQ.

The first digital filter 140 may adjust and/or calibrate the pull-up code PUCODE based on a comparison result of the comparator 130. In other words, the first digital filter 140 may adjust the pull-up code PUCODE based on a result generated by the comparator 130. The first digital filter 140 may increase or decrease the pull-up code PUCODE when the voltage VDIV is higher than or greater than the reference voltage VREFZQ, but is not limited thereto. The voltage VDIV after the pull-up code PUCODE is adjusted may be lower than or less than the voltage VDIV before the pull-up code PUCODE is adjusted, but is not limited thereto. In contrast, the first digital filter 140 may decrease or increase the pull-up code PUCODE when the voltage VDIV is lower than the reference voltage VREFZQ, but is not limited thereto. The voltage VDIV after the pull-up code PUCODE is adjusted may be higher than the voltage VDIV before the pull-up code PUCODE is adjusted, but is not limited thereto. In at least one example embodiment, the first digital filter 140 may include at least one adder and at least one multiplier, but the example embodiments are not limited thereto. At least one coefficient used in the first digital filter 140 may be determined according to stability of a first path (a pull-up calibration path) to be described later.

The pull-down unit 150 (e.g., pull-down transistor and/or pull-down resistor, etc.) may be connected between the pad 110 connected with the external resistor RZQ and the power supply voltage VSSQ depending on a pull-down code PDCODE. A resistance value of the pull-down unit 150 may vary or may be changed depending on (and/or based on) the pull-down code PDCODE. The pull-down unit 150 may be a variable resistance unit (e.g., variable resistor, etc.) or a pull-down resistance unit (e.g., pull-down resistor, etc.) having a variable resistance value depending on the pull-down code PDCODE.

As in the first digital filter 140, the second digital filter 160 may adjust or calibrate the pull-down code PDCODE based on a comparison result of the comparator 130. In other words, the second digital filter 160 may adjust the pull-down code PDCODE based on a result generated by the comparator 130. The second digital filter 160 may increase or decrease the pull-down code PDCODE when the voltage VDIV is higher than the reference voltage VREFZQ, but is not limited thereto. In contrast, the second digital filter 160 may decrease or increase the pull-down code PDCODE when the voltage VDIV is lower than the reference voltage VREFZQ, but is not limited thereto. As in the first digital filter 140, the second digital filter 160 may include at least one adder and at least one multiplier, etc., but is not limited thereto. At least one coefficient used in the second digital filter 160 may be determined according to stability of a second path (a pull-down calibration path) to be described later.

The controller 170 may generate a first control signal ZQPU_EN for activating the first digital filter 140. The first digital filter 140 may be activated and may adjust the pull-up code PUCODE during an interval or a period (e.g., a desired length of time) in which the first control signal ZQPU_EN is activated. The controller 170 may generate a second control signal ZQPD_EN for activating the second digital filter 160. The second digital filter 160 may be activated and may adjust the pull-down code PDCODE during an interval or a period in which the second control signal ZQPD_EN is activated, following the interval where the first control signal ZQPU_EN is activated.

For on-die termination, the calibration circuit 100 may adjust the pull-up code PUCODE such that a resistance value of each of the pull-up units, e.g., pull-up units 120_1 and 120_2, is identical to the resistance value of the external resistor RZQ, and then may adjust the pull-down code PDCODE such that a resistance value of the pull-down unit, e.g., pull-down unit 150, is identical to the resistance value of the external resistor RZQ. An operation in which the calibration circuit 100 first adjusts the pull-up code PUCODE prior to the pull-down code PDCODE will be described with reference to FIG. 1.

The pull-up code PUCODE may be adjusted through the first path (e.g., the pull-up code PUCODE may be transmitted through the first path). The first path may include the one pull-up unit 120_1 of the pull-up units 120_1 and 120_2, the pad 110, the common node connected to the pad 110, the comparator 130, and/or the first digital filter 140, etc., but the example embodiments are not limited thereto and may contain greater or lesser number of constituent components.

The controller 170 may activate (e.g., start outputting, start transmitting, etc.) the first control signal ZQPU_EN and may deactivate (e.g., stop outputting, stop transmitting, etc.) the second control signal ZQPD_EN. The first digital filter 140 may be activated depending on and/or based on the first control signal ZQPU_EN. In contrast, the pull-up unit 120_2, the pull-down unit 150, the second digital filter 160 may be deactivated depending on and/or based on the second control signal ZQPD_EN. When the pull-up unit 120_2 is deactivated, the pull-up unit 120_2 may not be electrically connected between the power supply voltage VDDQ and the pad 110. For example, the pull-up unit 120_2 may be electrically opened (e.g., an open circuit), and a resistance value of the pull-up unit 120_2 may be very great (e.g., infinite, etc.). When the pull-down unit 150 is deactivated, the pull-down unit 150 may not be electrically connected between the pad 110 and the power supply voltage VSSQ. For example, the pull-down unit 150 may be electrically opened (e.g., an open circuit), and a resistance value of the pull-down unit 150 may be very great (e.g., infinite, etc.).

A level of the voltage VDIV (e.g., voltage value of VDIV) may be determined by voltage division determined according to the difference between the power supply voltages VDDQ and VSSQ, the pull-up unit 120_1, and/or the external resistor RZQ, etc. Since the pull-up unit 120_2 is deactivated, the pull-up unit 120_1 and the external resistor RZQ may be connected in series between the power supply voltages VDDQ and VSSQ. For example, in the case where the power supply voltage VSSQ is a ground voltage and a resistance value of the pull-up unit 120_1 is "RU" changed depending on (e.g., set based on) the pull-up code PUCODE, the level of the voltage VDIV may be the equation "VDDQ×[RZQ]/[RU+RZQ]", but the example embodiments are not limited thereto.

The comparator 130 may compare the first level of the voltage VDIV with a level of the reference voltage VREFZQ and generate a result. The reference voltage VREFZQ may be set, (e.g., set in advance, or set in real-time, etc.) to "VDDQ×0.5" such that the resistance value of the pull-up unit 120_1 is identical to the resistance value of the external resistor RZQ. The first digital filter 140 may adjust the pull-up code PUCODE based on the generated result of the comparator 130 such that the resistance value of the pull-up unit 120_1 is identical to the reference value of the external resistor RZQ or such that the level of the voltage VDIV is identical to the level of the reference voltage VREFZQ.

The first digital filter 140 may store the adjusted pull-up code PUCODE, that is, a final pull-up code to a register 141. The final pull-up code may have a fixed value, and a resistance value of the pull-up unit 120_1 depending on (e.g., set by) the final pull-up code may be identical to the resistance value of the external resistor RZQ. The register 141 is illustrated in FIG. 1 as being included in the first digital filter 140, but the example embodiments are not limited thereto and, for example, the register 141 may be separated from the first digital filter 140 and may be implemented within the calibration circuit 100 or any other device, etc.

The calibration circuit 100 may adjust the pull-down code PDCODE through the second path after adjusting the pull-up code PUCODE through the first path. The calibration circuit 100 may not adjust the pull-down code PDCODE while the pull-up code PUCODE is adjusted, but is not limited thereto. An operation in which the calibration circuit 100 adjusts the pull-down code PDCODE will be described with reference to FIG. 2.

The pull-down code PDCODE may be adjusted through the second path (e.g., the pull-down code PDCODE may be transmitted through the second path). The second path may include the pull-down unit 150, the pad 110, the common node connected to the pad 110, the comparator 130, and/or the second digital filter 160, etc., but the example embodiments are not limited thereto and there may be a greater or lesser number of constituent elements included in the second path. While the pull-down code PDCODE is adjusted, the pull-up units 120_1 and 120_2 may be activated, and the final pull-up code may be respectively provided to the pull-up units 120_1 and 120_2. The pull-up units 120_1 and 120_2 may be connected in parallel between the power supply voltage VDDQ and the pad 110, and a resistance value of each of the pull-up units 120_1 and 120_2 may become identical to the resistance value of the external resistor RZQ depending on the final pull-up code, but the example embodiments are not limited thereto.

The controller 170 may deactivate (e.g., stop outputting, stop transmitting, etc.) the first control signal ZQPU_EN and may activate (e.g., start outputting, start transmitting, etc.) the second control signal ZQPD_EN. The first digital filter 140 may be deactivated depending on (e.g., based on) the first control signal ZQPU_EN. In contrast, the second digital filter 160 may be activated depending on (e.g., based on) the second control signal ZQPD_EN. The register 141 may provide the final pull-up code respectively to the pull-up units 120_1 and 120_2 depending on the second control signal ZQPD_EN.

The level of the voltage VDIV (e.g., voltage value of VDIV, etc.) may be determined by voltage division determined according to the difference between the power supply voltages VDDQ and VSSQ, the pull-up units 120_1 and 120_2, the external resistor RZQ, and/or the pull-down unit 150, etc. For example, while the pull-down code PDCODE is adjusted through the second path, the external resistor RZQ and the pull-down unit 150 may be connected in parallel between the pad 110 and the power supply voltage VSSQ. Accordingly, to adjust the resistance value of the pull-down unit 150 to the resistance value of the external resistor RZQ while maintaining the reference voltage VREFZQ, the pull-up units 120_1 and 120_2 may also be connected in parallel between the power supply voltage VDDQ and the pad 110. For example, a combined resistance value (or a total resistance value) of the pull-up units 120_1 and 120_2 connected in parallel may be half the resistance value of one pull-up unit, but is not limited thereto.

A first group, for example including the pull-up units 120_1 and 120_2, and a second group, for example including the external resistor RZQ and the pull-down unit 150, may be connected in series between the power supply voltages VDDQ and VSSQ, however the example embodiments are not limited thereto. For example, in the case where the power supply voltage VSSQ is a ground voltage, a resistance value of each of the pull-up units 120_1 and 120_2 is a fixed "RU" depending on the pull-up code PUCODE, and a resistance value of the pull-down unit 150 is a variable "RD" depending on the pull-down code PDCODE, the level of the voltage VDIV may be "VDDQ×[RZQ∥RD]/[(RU∥RU)+(RZQ∥RD)]". Since "RU" is fixed to "RZQ" depending on the final pull-up code, the level of the voltage VDIV may be "VDDQ×[RZQ∥RD]/[(RZQ/2)+(RZQ∥RD)]", however the example embodiments are not limited thereto.

The comparator 130 may compare the second level of the voltage VDIV with the level of the reference voltage VREFZQ and generate a result. Like the case where the pull-up code PUCODE is adjusted, the reference voltage VREFZQ may be maintained at, for example, "VDDQ×0.5", but is not limited thereto. The second digital filter 160 may adjust the pull-down code PDCODE based on the result generated by the comparator 130 such that the resistance value of the pull-down unit 150 is identical to the reference value of the external resistor RZQ or such that the level of the voltage VDIV is identical to the level of the reference voltage VREFZQ, or another desired value.

The second digital filter 160 may store the adjusted pull-down code PDCODE, that is, a final pull-down code, in a register 161. The final pull-down code may have a fixed value, and a resistance value of the pull-down unit 150 depending on the final pull-down code may be identical to the resistance value of the external resistor RZQ, but the example embodiments are not limited thereto. The register 161 is illustrated in FIG. 2 as being included in the second digital filter 160, but the register 161 may be separate from the second digital filter 160 and may be implemented within the calibration circuit 100 or any other device.

As described above, the voltage VDIV of the common node generated through (e.g., transmitted through) the first path may be determined by voltage division which is made according to the difference between the power supply voltages VDDQ and VSSQ, the one pull-up unit 120_1, and/or the external resistor RZQ, etc. The voltage VDIV of the common node generated through the second path may be determined by voltage division which is made according to the difference between the power supply voltages VDDQ and VSSQ, the two pull-up units 120_1 and 120_2, the external resistor RZQ, and/or the pull-down unit 150, etc. Since the level of the reference voltage VREFZQ is identically maintained while the pull-up code PUCODE and the pull-down code PDCODE are adjusted, both the first level of the voltage VDIV of the common node generated through (e.g., transmitted through) the first path and the second level of the voltage VDIV of the common node generated through (e.g., transmitted through) the second path may be converged to the level (e.g., VDDQ×0.5) of the reference voltage VREFZQ.

In at least one example embodiment, the comparator 130 may operate when the pull-up code PUCODE is adjusted through the first path, and/or may also operate when the pull-down code PDCODE is adjusted through the second path. The first digital filter 140 may adjust (e.g., filter, modify, recalculate, etc.) the pull-up code PUCODE based on a first comparison result of the comparator 130. The second digital filter 160 may adjust (e.g., filter, modify, recalculate, etc.) the pull-down code PDCODE based on a second comparison result of the comparator 130. That is, the first and second digital filters 140 and 160 may share the comparator 130, but the example embodiments are not limited thereto. The first comparison result may indicate a result of comparing a first voltage VDIV of the common node generated through the first path with the reference voltage VREFZQ, and the second comparison result may indicate a result of comparing a second voltage VDIV of the common node generated through the second path with the reference voltage VREFZQ. Since both a voltage generated through the first path and a voltage generated through the second path are generated at (e.g., located at and/or detected at) a node connected to the pad 110, the node connected to the pad 110 may be referred to as a "common node". Each of the first path and the second path may include the common node. For example, the common node may be positioned on a path between the pad 110 and the comparator 130 or on a path between the pad 110 and the pull-down unit 150.

Unlike the above example embodiment, a calibration unit of the conventional art may have a first comparator for adjusting the pull-up code PUCODE and another comparator (e.g., a second comparator) for adjusting the pull-down code PDCODE in the calibration circuit, and thus the PVT variation may occur at the respective comparators. Also, in another calibration unit of the conventional art, nodes at which the voltage VDIV are generated are different from each other and do not share a common node, the PVT variation may occur at each of the respective nodes. In contrast, the calibration circuit 100 according to at least one example embodiment of the inventive concepts may adjust both the pull-up code PUCODE and the pull-down code PDCODE by using the common node shared by the first path and the second path and the one comparator 130 connected to the common node. In this case, the PVT variation of the calibration circuit 100 may decrease in comparison to the conventional art, and the rank margin tool RMT may be improved. Compared with a calibration circuit in which a pull-up calibration path and a pull-down calibration path are separated from each other, the calibration circuit 100 of at least one example embodiment may match the resistance value of each of the pull-up units 120_1 and 120_2 to the resistance value of the external resistor RZQ more exactly, and may match the resistance value of the pull-down unit 150 to the resistance value of the external resistor RZQ more exactly.

In at least one example embodiment, the calibration circuit 100 may further include a voltage divider (not illustrated) which generates the reference voltage VREFZQ. For example, the voltage divider may include resistors connecting the power supply voltages VDDQ and VSSQ, and the resistors may be connected in series to each other. A ratio of the resistors may be determined depending on and/or based on a level of the reference voltage VREFZQ set in advance and/or set in real-time, etc.

Figure 3:
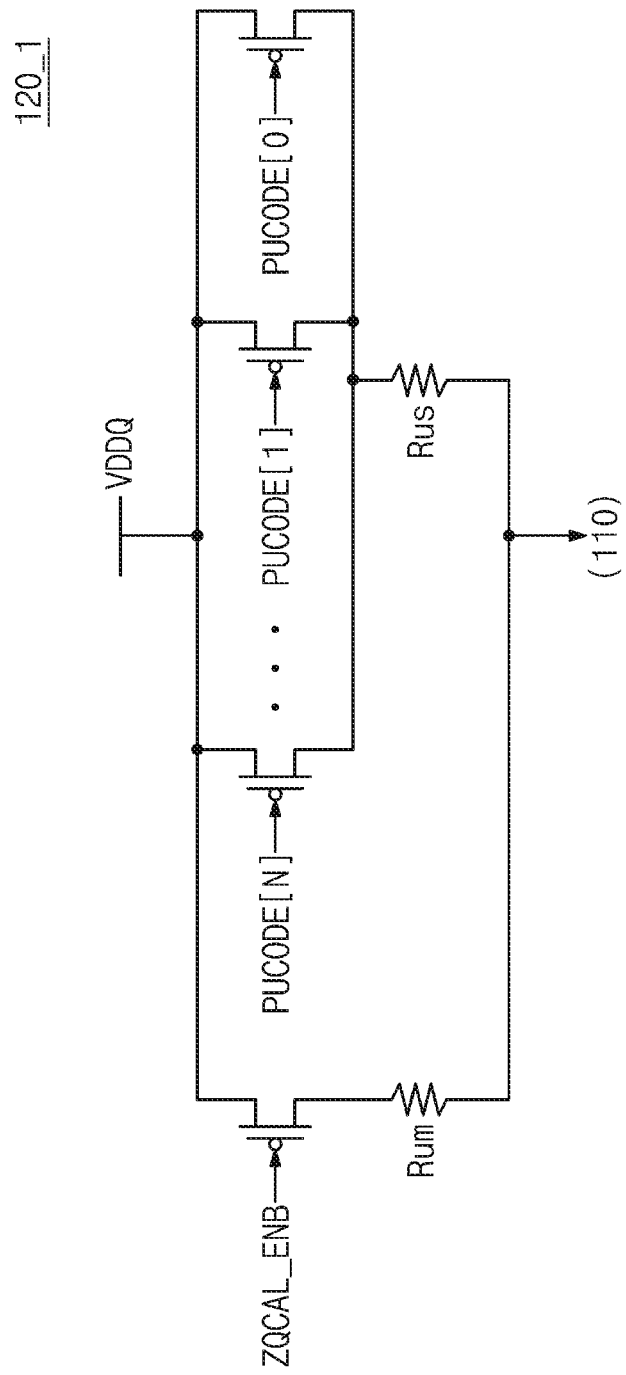
FIG. 3 is a block diagram illustrating a pull-up unit of FIGS. 1 and 2 according to at least one example embodiment.

FIG. 3 is a block diagram illustrating a pull-up unit of FIGS. 1 and 2 according to at least one example embodiment. The pull-up unit 120_1 of FIG. 3 may be the pull-up unit 120_1 of FIGS. 1 and 2, but is not limited thereto.

The pull-up unit 120_1 may include a resistor Rus connected between switches receiving the pull-up code PUCODE[0:N] (N being a natural number) and the pad 110, but is not limited thereto. The pull-up unit 120_1 may include the switches (e.g., transistors, etc.) electrically connecting the power supply voltage VDDQ and the resistor Rus depending on the pull-up code PUCODE[0:N] having (N+1) bits. The switch receiving the pull-up code PUCODE[0] through a gate terminal may be turned on or turned off depending on the pull-up code PUCODE[0]. The remaining switches receiving the remaining pull-up code PUCODE[1:N] may also operate in the above-described manner. A p-channel metal oxide semiconductor (PMOS) transistor is illustrated in FIG. 3 as an example of the switch, but the switches each connecting the resistor Rus and the power supply voltage VDDQ may be implemented using a PMOS transistor, an n-channel metal oxide semiconductor (NMOS) transistor, a combination of the PMOS transistor and the NMOS transistor, etc.

The pull-up unit 120_1 may further include a transistor which is turned on during a calibration operation and/or a resistor Rum connected to the transistor, but is not limited thereto. A control signal ZQCAL_ENB may indicate a calibration operation interval. The calibration operation interval may include both an interval (e.g., a time interval, a time period, etc.) where the pull-up code PUCODE is adjusted and an interval (e.g., a time interval, a time period, etc.) where the pull-down code PDCODE is adjusted. For example, the control signal ZQCAL_ENB may have logic "0" in the interval where the pull-up code PUCODE is adjusted and the interval where the pull-down code PDCODE is adjusted, and may electrically connect the power supply voltage VDDQ and the resistor Rum, but the example embodiments are not limited thereto. The resistor Rum may be electrically connected between the power supply voltage VDDQ and the pad 110 depending on the control signal ZQCAL_ENB regardless of the pull-up code PUCODE[0:N].

A combined resistance value (or an equivalent resistance value) of the pull-up unit 120_1 may be determined by the resistors Rum and Rus and the switches depending on the control signal ZQCAL_ENB and the pull-up code PUCODE. For example, when the control signal ZQCAL_ENB is activated and the final pull-up code is provided to the pull-up unit 120_1, the combined resistance value of the pull-up unit 120_1 may be identical to the resistance value (e.g., 240Ω) of the external resistor RZQ.

In at least one example embodiment, unlike the illustration of FIG. 3, the locations of the switches and locations of the resistors Rum and Rus may be interchangeable. For example, the resistors Rum and Rus may be connected between the power supply voltage VDDQ and the switches, but the example embodiments are not limited thereto. As another example, the switches may be connected between the resistors Rum and Rus and the pad 110, etc.

In at least one example embodiment, the pull-up unit 120_2 of FIGS. 1 and 2 may be implemented identically to the pull-up unit 120_1 of FIG. 3, but is not limited thereto. However, all of the switches connected to the resistors Rum and Rus of the pull-up unit 120_2 may be turned off while the pull-up code PUCODE is adjusted. The final pull-up code may be provided to the switches connected with the resistor Rus of the pull-up unit 120_2 while the pull-down code PDCODE is adjusted. Instead of the control signal ZQCAL_ENB, another control signal ZQPD_ENB may be provided to the switch connected to the resistor Rum of the pull-up unit 120_2 while the pull-down code PDCODE is adjusted. The control signal ZQPD_ENB may be an inverted version of the second control signal ZQPD_EN, and may turn on the switch connected with the resistor Rum of the pull-up unit 120_2 while the pull-down code PDCODE is adjusted.

Figure 4:
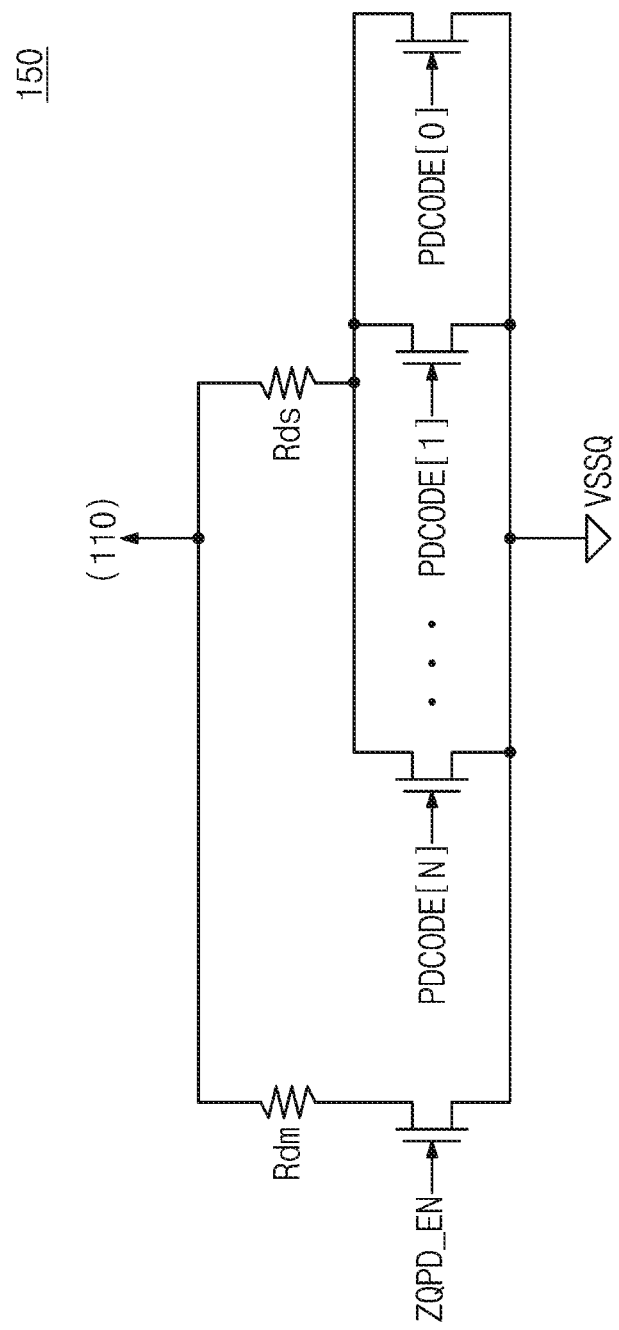
FIG. 4 is a block diagram illustrating a pull-down unit of FIGS. 1 and 2 according to at least one example embodiment.

FIG. 4 is a block diagram illustrating a pull-down unit of FIGS. 1 and 2 according to at least one example embodiment. The pull-down unit 150 of FIG. 4 may be the pull-down unit 150 of FIGS. 1 and 2, but is not limited thereto.

The pull-down unit 150 may include a resistor Rds connected between the pad 110 and switches receiving the pull-down code PDCODE[0:N] (N being a natural number). The pull-down unit 150 may include the switches (transistors) electrically connecting the power supply voltage VSSQ and the resistor Rds depending on the pull-down code PDCODE[0:N] having (N+1) bits. For example, the switch receiving the pull-down code PDCODE[0] through a gate terminal may be turned on or turned off depending on the pull-down code PDCODE[0], but the example embodiments are not limited thereto. The remaining switches receiving the remaining pull-down code PDCODE[1:N] may also operate in the above-described manner, but are not limited thereto. An NMOS transistor is illustrated in FIG. 4 as an example of the switch, but the switches each connecting the resistor Rds and the power supply voltage VSSQ may be implemented using a PMOS transistor, an NMOS transistor, a combination of the PMOS transistor and the NMOS transistor, etc.

The pull-down unit 150 may further include a transistor which is turned on while the pull-down code PDCODE is adjusted, and a resistor Rdm connected to the transistor, etc. For example, the second control signal ZQPD_EN described with reference to FIGS. 1 and 2 may have logic "1" in an interval where the pull-down code PDCODE is adjusted, and may connect the power supply voltage VSSQ and the resistor Rdm, but is not limited thereto. The resistor Rdm may be electrically connected between the power supply voltage VSSQ and the pad 110 depending on the second control signal ZQPD_EN regardless of the pull-down code PDCODE[0:N].

A combined resistance value of the pull-down unit 150 may be determined by the resistors Rdm and Rds and the switches depending on the second control signal ZQPD_EN and the pull-down code PDCODE. When the second control signal ZQPD_EN is activated and the final pull-down code is provided to the pull-down unit 150, the combined resistance value of the pull-down unit 150 may be identical to the resistance value (e.g., 240Ω) of the external resistor RZQ, but the example embodiments are not limited thereto.

In at least one example embodiment, unlike the illustration of FIG. 4, the locations of the switches and locations of the resistors Rdm and Rds may be interchangeable. For example, the resistors Rdm and Rds may be connected between the power supply voltage VSSQ and the switches, etc. As another example, the switches may be connected between the resistors Rdm and Rds and the pad 110, etc.

In at least one example embodiment, a description is given with reference to FIGS. 3 and 4 as the number of bits of the pull-up code PUCODE[0:N] and the number of bits of the pull-down code PDCODE[0:N] are identical to each other, that is, are identically (N+1), but the number of bits of the pull-up code PUCODE[0:N] and the number of bits of the pull-down code PDCODE[0:N] may be different from each other. The number of switches of the pull-up unit 120_1 and the number of switches of the pull-down unit 150 may be different from each other.

Figure 5:
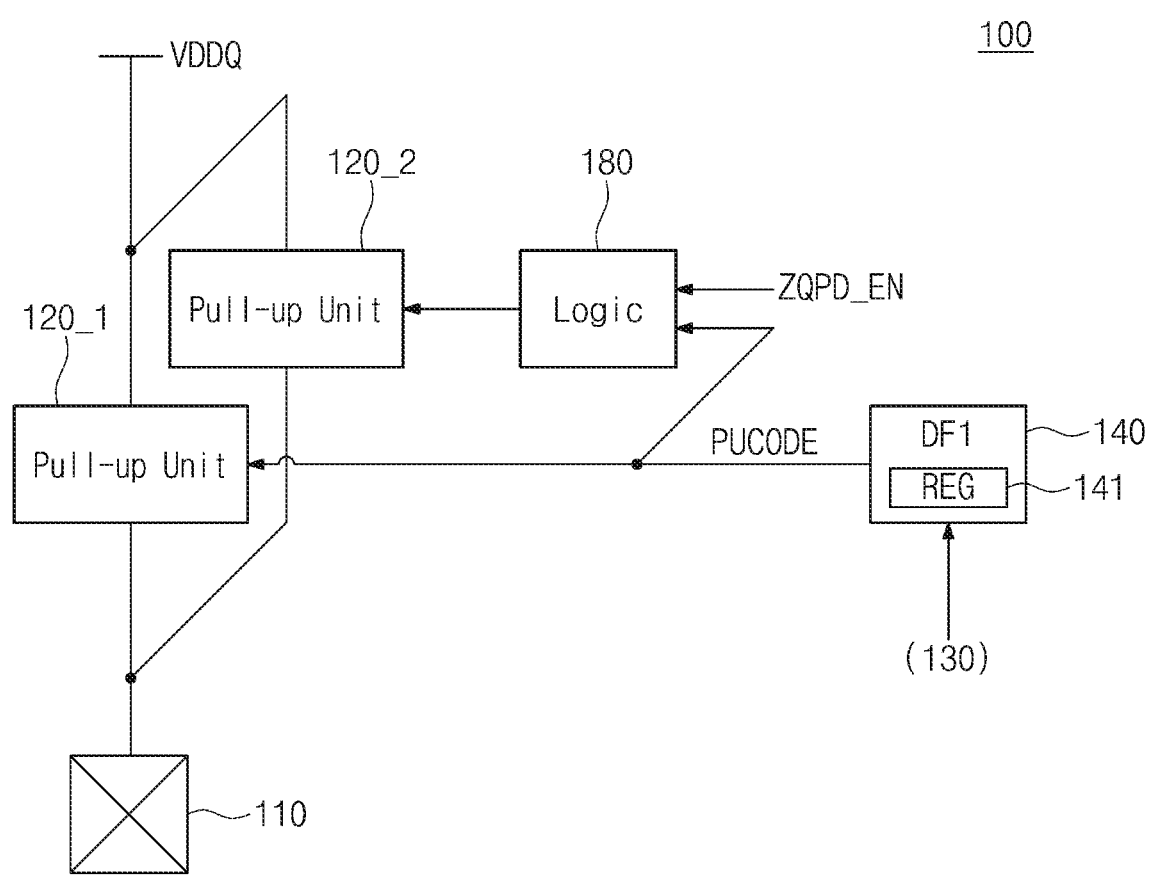
FIG. 5 is a block diagram illustrating a calibration circuit of FIGS. 1 and 2, according to at least one example embodiment.

FIG. 5 is a block diagram illustrating a calibration circuit of FIGS. 1 and 2, according to at least one example embodiment. The pad 110, the pull-up units 120_1 and 120_2, and the first digital filter 140 were illustrated in FIG. 5, but the example embodiments are not limited thereto, and the remaining components of the calibration circuit 100 are omitted. For example, the calibration circuit 100 may further include a logic (e.g., a logic circuit, etc.) 180 for connection of the pull-up unit 120_2, etc.

As described above, while the pull-up code PUCODE is adjusted, the pull-up code PUCODE may be provided to the pull-up unit 120_1 and may not be provided to the pull-up unit 120_2. The logic 180 may not provide the pull-up code PUCODE to the pull-up unit 120_2 when the second control signal ZQPD_EN is deactivated. For example, the logic 180 may provide the pull-up unit 120_2 with a block code instead of the pull-up code PUCODE of the first digital filter 140 based on the second control signal ZQPD_EN, but the example embodiments are not limited thereto. All of the transistors of the pull-up unit 120_2 may be turned off by the block code, and thus, the pull-up unit 120_2 may be blocked, but the pull-up unit is not limited thereto. The pull-up unit 120_2 may not be electrically connected between the power supply voltage VDDQ and the pad 110 when the second control signal ZQPD_EN is deactivated.

The logic 180 may provide the pull-up code PUCODE to the pull-up unit 120_2 when the second control signal ZQPD_EN is activated. Here, the pull-up code PUCODE may be stored in the register 141, and may be a fixed final pull-up code, but the example embodiments are not limited thereto. The logic 180 may be implemented by using a combination of various logic gates (e.g., INV, NAND, NOR, AND, OR, XNOR, and XOR, etc.).

Figure 6:
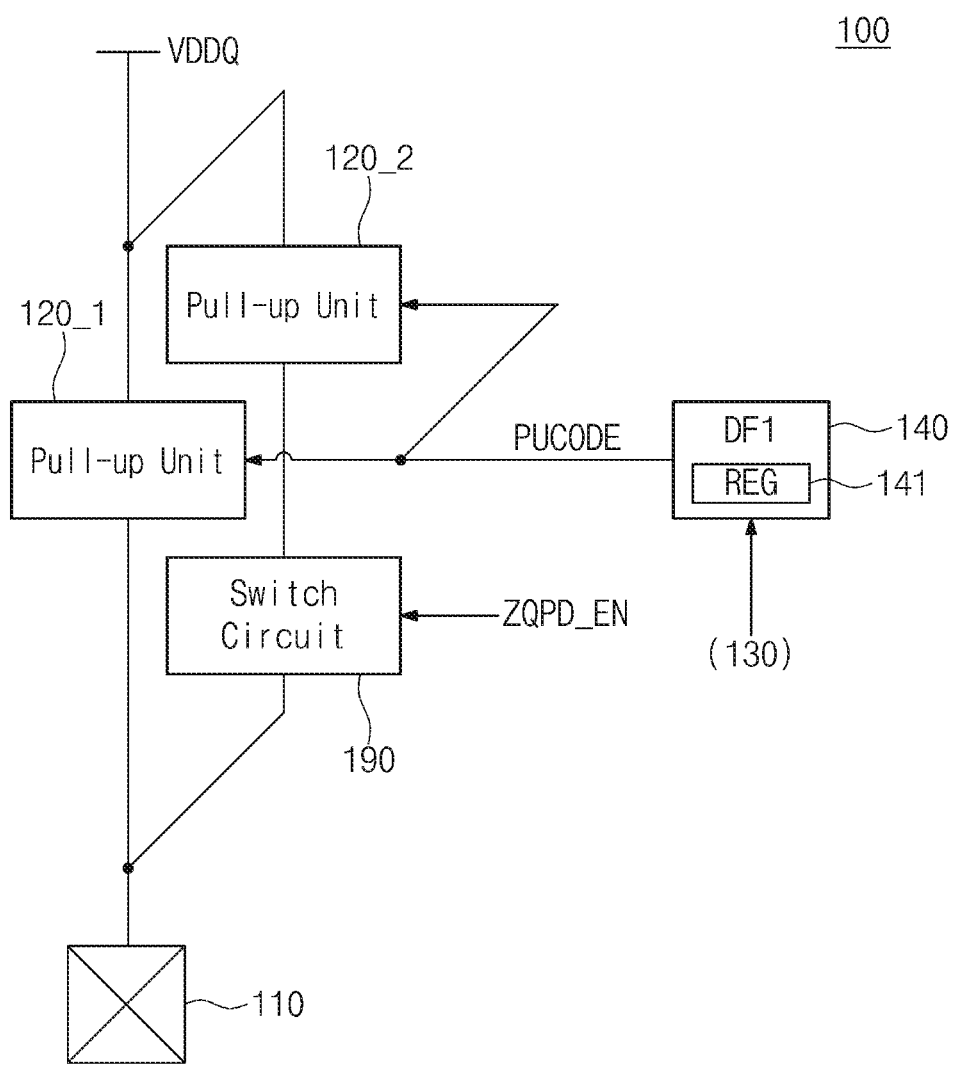
FIG. 6 is a block diagram illustrating a calibration circuit of FIGS. 1 and 2, according to at least one example embodiment.

FIG. 6 is a block diagram illustrating a calibration circuit of FIGS. 1 and 2, according to at least one example embodiment. The pad 110, the pull-up units 120_1 and 120_2, and the first digital filter 140 were previously illustrated in FIG. 6, but are not limited thereto, and the remaining components of the calibration circuit 100 are omitted. For example, the calibration circuit 100 may further include a switch circuit 190 for connection of the pull-up unit 120_2, but is not limited thereto.

Unlike the above examples, the pull-up code PUCODE of the first digital filter 140 may be provided to all of the pull-up units 120_1 and 120_2. Each of the pull-up units 120_1 and 120_2 may receive the pull-up code PUCODE adjusted through the first path, and may receive the final pull-up code stored in the register 141 while the pull-down code PDCODE is adjusted through the second path, but is not limited thereto.

The switch circuit 190 may connect the pull-up unit 120_2 and the pad 110 depending on (e.g., based on) the second control signal ZQPD_EN. The switch circuit 190 may connect the pull-up unit 120_2 and the pad 110 only when the second control signal ZQPD_EN is activated. For example, the switch circuit 190 may include transistors which electrically connect the respective resistors of the pull-up unit 120_2 and the pad 110 depending on the second control signal ZQPD_EN. Regardless of the example of FIG. 5 or the example of FIG. 6, the pull-up unit 120_2 may not be electrically connected between the power supply voltage VDDQ and the pad 110 while the pull-up code PUCODE is adjusted.

Figure 7:
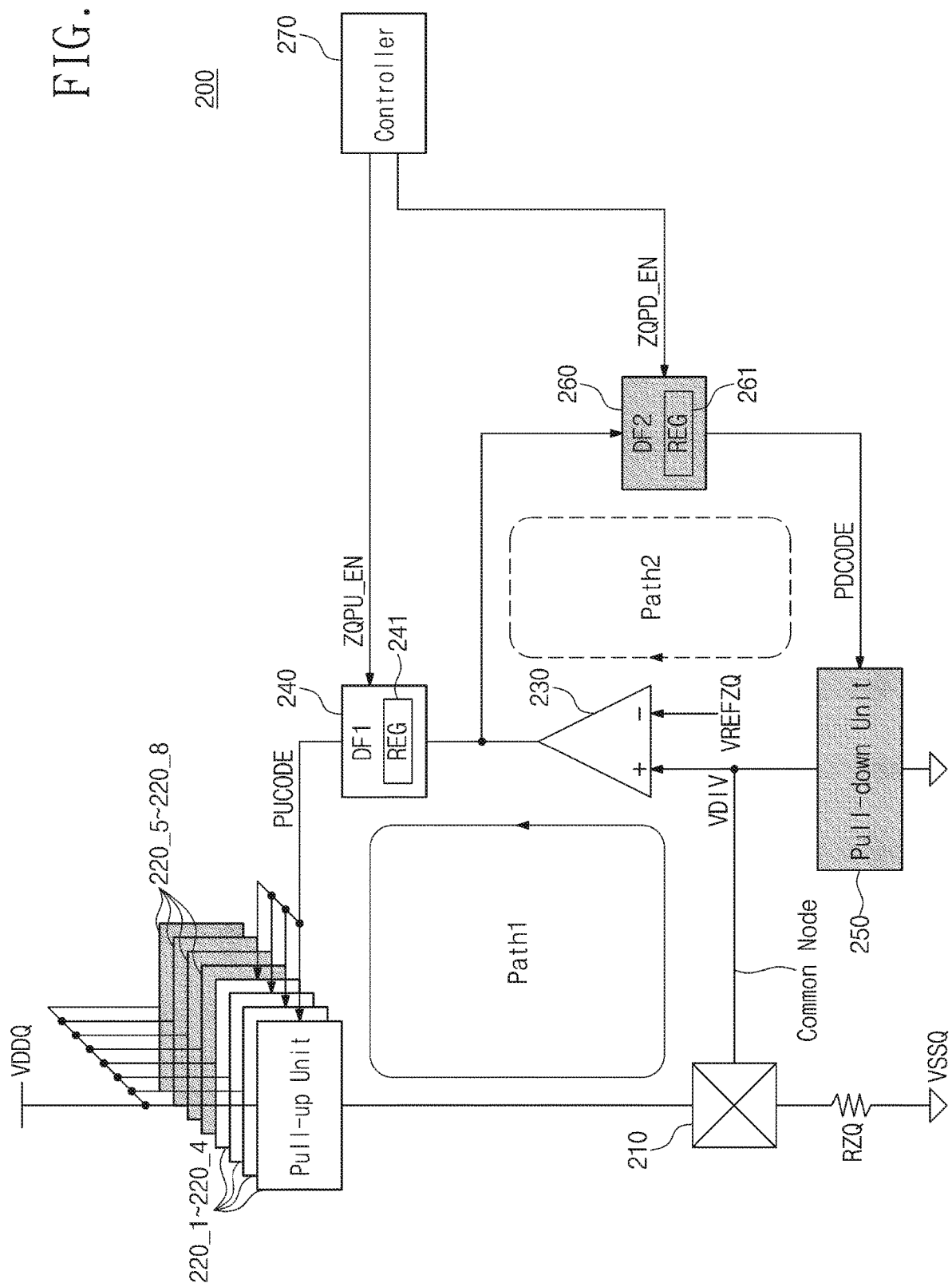
FIGS. 7 and 8 are block diagrams illustrating a calibration circuit according to at least one example embodiment of the inventive concepts.
Figure 8:
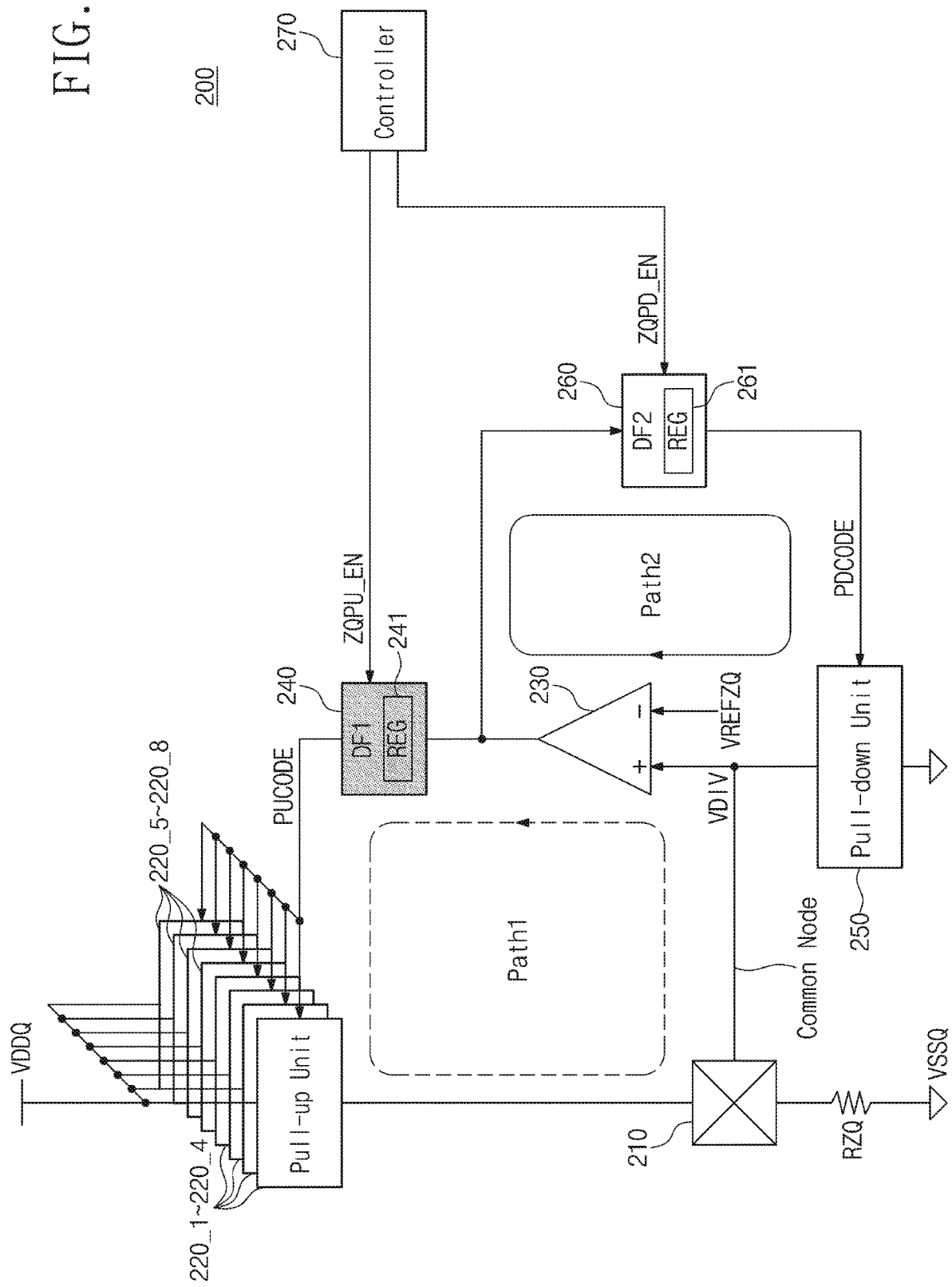

FIGS. 7 and 8 are block diagrams illustrating a calibration circuit according to at least one example embodiment of the inventive concepts. FIGS. 7 and 8 will be described together. A calibration circuit 200 may include a pad 210, pull-up units 220_1 to 220_8, a comparator 230, a first digital filter 240, a pull-down unit 250, a second digital filter 260, and/or a controller 270, etc., but the example embodiments are not limited thereto. An operation and a configuration of the calibration circuit 200 of FIGS. 7 and 8 may be similar to the operation and the configuration of the calibration circuit 100 of FIGS. 1 and 2, but is not limited thereto. Operations and configurations of components of FIGS. 7 and 8 may be similar to the operations and the configurations of the components of FIGS. 1 to 6, which have similar reference numerals. Below, a difference between the calibration circuit 200 and the calibration circuit 100 will be described.

Unlike the calibration circuit 100, the calibration circuit 200 may include eight pull-up units 220_1 to 220_8, but is not limited thereto. The pull-up code PUCODE may be adjusted through the first path. Referring to FIG. 7, the first path may include the pull-up units 220_1 to 220_4, the pad 210, the common node, the comparator 230, and/or the first digital filter 240, but is not limited thereto. While the pull-up code PUCODE is adjusted through the first path, the respective pull-up units 220_1 to 220_4 may be connected between the power supply voltage VDDQ and the pad 210, but the respective pull-up units 220_5 to 220_8 may not be connected between the power supply voltage VDDQ and the pad 210, but is not limited thereto. An operation and a configuration of each of the pull-up units 220_1 to 220_4 may be identical to the operation and the configuration of the pull-up unit 120_1 described with reference to FIGS. 1 and 2, but is not limited thereto. An operation and a configuration of each of the pull-up units 220_5 to 220_8 may be identical to the operation and the configuration of the pull-up unit 120_2 described with reference to FIGS. 1 and 2, but is not limited thereto.

A level of the voltage VDIV may be determined by voltage division determined according to a difference between the power supply voltages VDDQ and VSSQ, the four pull-up units 220_1 to 220_4, and the external resistor RZQ, but is not limited thereto. The pull-up units 220_1 to 220_4 may be connected in parallel, but is not limited thereto. For example, in the case where the power supply voltage VSSQ is a ground voltage and a resistance value of each of the pull-up units 220_1 to 220_4 is "RU", the level of the voltage VDIV may be "VDDQ×[RZQ]/[(RU/4)+RZQ]". Unlike the case of FIGS. 1 and 2, the reference voltage VREFZQ may be in advance set to "VDDQ×0.8" such that a resistance value of each of the pull-up units 220_1 to 220_4 is identical to a resistance value of the external resistor RZQ, but the example embodiments are not limited thereto, and for example, the reference voltage may be set in real-time. As the number of pull-up units included in the first path increases, a level of the reference voltage VREFZQ may also increase. The number of pull-up units and the level of the reference voltage VREFZQ are not limited to the above-described examples. The number of pull-up units may be determined according to a level of the reference voltage VREFZQ set in advance and/or real-time. For example, in the case where the number of pull-up units is "M", the level of the reference voltage VREFZQ may be "VDDQ×[RZQ]/[RZQ/(M/2)+RZQ]". The first digital filter 240 may store the adjusted pull-up code PUCODE, that is, a final pull-up code to a register 241.

As in the calibration circuit 100, the calibration circuit 200 may adjust the pull-down code PDCODE through the second path after adjusting the pull-up code PUCODE through the first path. Referring to FIG. 8, the second path may include the pull-down unit 250, the pad 210, the common node, the comparator 230, and the second digital filter 260. Here, while the pull-down code PDCODE is adjusted, all of the pull-up units 220_1 to 220_8 may be activated, and the final pull-up code may be respectively provided to the pull-up units 220_1 to 220_8, but the example embodiments are not limited thereto. The pull-up units 220_1 to 220_8 may be connected in parallel between the power supply voltage VDDQ and the pad 210, and a resistance value of each of the pull-up units 220_1 to 220_8 is identical to the resistance value of the external resistor RZQ depending on the final pull-up code.

The level of the voltage VDIV may be determined by voltage division determined according to (e.g., based on) the difference between the power supply voltages VDDQ and VSSQ, the eight pull-up units 220_1 to 220_8, the external resistor RZQ, and/or the pull-down unit 250, etc. While the pull-down code PDCODE is adjusted through the second path, the external resistor RZQ and the pull-down unit 250 may be connected in parallel between the pad 210 and the power supply voltage VSSQ, but the example embodiments are not limited thereto. Accordingly, to adjust the resistance value of the pull-down unit 250 to the resistance value of the external resistor RZQ while maintaining the reference voltage VREFZQ, the pull-up units 220_1 to 220_8 may also be connected in parallel, but the example embodiments are not limited thereto.

A group of the pull-up units 220_1 to 220_8, a group of the external resistor RZQ, and/or the pull-down unit 250 may be connected in series between the power supply voltages VDDQ and VSSQ, but the example embodiments are not limited thereto. For example, in the case where the power supply voltage VSSQ is a ground voltage, a resistance value of each of the pull-up units 220_1 to 220_8 is "RU", and a resistance value of the pull-down unit 250 is "RD", the level of the voltage VDIV may be "VDDQ×[RZQ||RD]/[(RU/8)+(RZQ||RD)]". Since "RU" is "RZQ" depending on the final pull-up code, the level of the voltage VDIV may be "VDDQ×[RZQ||RD]/[(RZQ/8)+(RZQ||RD)]" Like the case where the pull-up code PUCODE is adjusted, the reference voltage VREFZQ may be maintained at "VDDQ×0.8", but is not limited thereto. The second digital filter 260 may store the adjusted pull-down code PDCODE, that is, a final pull-down code to a register 261.

Figure 9:
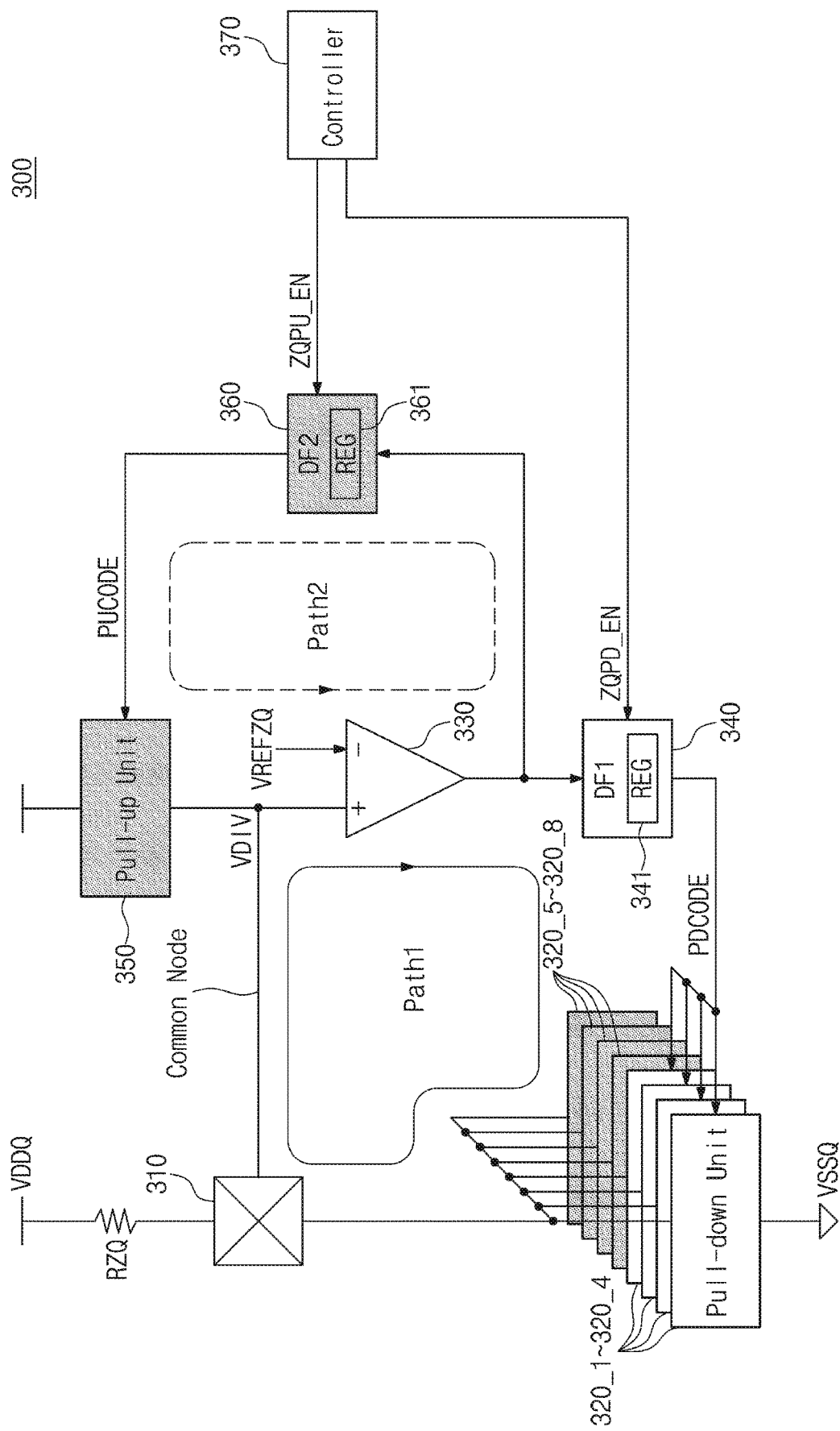
FIGS. 9 and 10 are block diagrams illustrating a calibration circuit according to at least one example embodiment of the inventive concepts.
Figure 10:
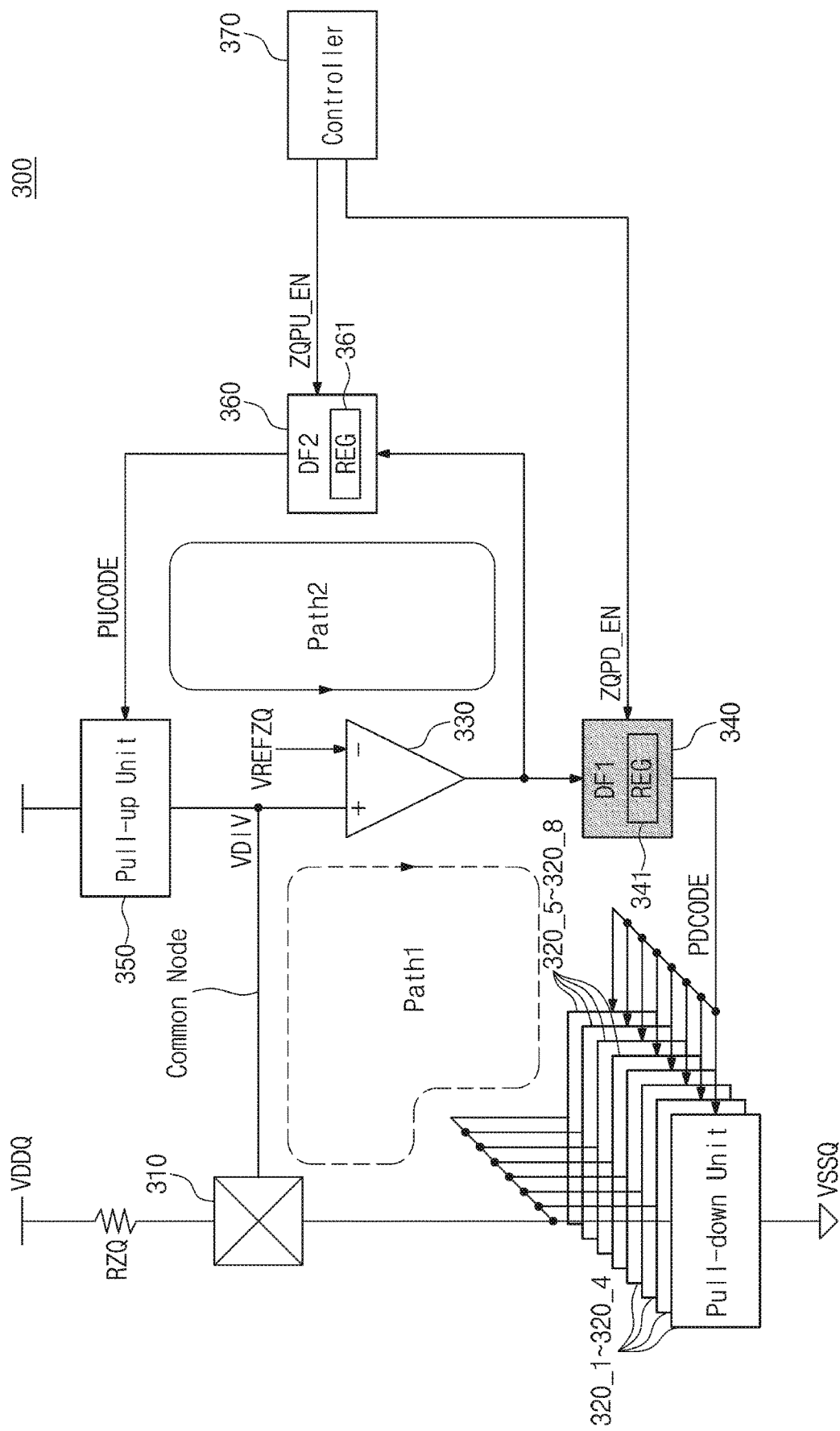

FIGS. 9 and 10 are block diagrams illustrating a calibration circuit according to at least one example embodiment of the inventive concepts. FIGS. 9 and 10 will be described together. A calibration circuit 300 may include a pad 310, pull-down units 320_1 to 320_8, a comparator 330, a first digital filter 340, a pull-up unit 350, a second digital filter 360, and/or a controller 370, but is not limited thereto. An operation or a configuration of the calibration circuit 300 may be similar to the operation or the configuration of the calibration circuits 100 and 200, but is not limited thereto. Operations and configurations of components of FIGS. 9 and 10 may be similar to the operations and the configurations of the components of FIGS. 1 to 8, which have similar reference numerals, but are not limited thereto. Below, a difference between the calibration circuit 300 and the calibration circuits 100 and 200 will be described.

Unlike the above examples, the external resistor RZQ may be connected between the power supply voltage VDDQ and the pad 310, not between the pad 310 and the power supply voltage VSSQ. The respective pull-down units 320_1 to 320_8 may be connected between the pad 310 connected with the external resistor RZQ and the power supply voltage VSSQ depending on the pull-down code PDCODE. The pull-down units 320_1 to 320_8 may be identically implemented, and each of the pull-down units 320_1 to 320_8 may include the resistors Rdm and Rds and the transistors of FIG. 4, but are not limited thereto.

The comparator 330 may compare the voltage VDIV of the common node with the reference voltage VREFZQ. For example, a first level of the voltage VDIV may be determined by voltage division determined according to (e.g., based on) a difference between the power supply voltages VDDQ and VSSQ, the pull-down units 320_1 to 320_4, and/or the external resistor RZQ, etc. For another example, a second level of the voltage VDIV may be determined by voltage division determined according to the difference between the power supply voltages VDDQ and VSSQ, the pull-down units 320_1 to 320_8, the pull-up unit 350, and/or the external resistor RZQ, etc. An operation or a configuration of the comparator 330 may be similar to the operation or the configuration of the above-described comparator 130 and 230, but is not limited thereto.

The first digital filter 340 may adjust or change the pull-down code PDCODE based on a comparison result of the comparator 330. In other words, the pull-down code PDCODE may be based on an output of the comparator 330. The first digital filter 340 may increase or decrease the pull-down code PDCODE when, for example, the voltage VDIV is higher than the reference voltage VREFZQ, but the example embodiments are not limited thereto. In contrast, the first digital filter 340 may decrease or increase the pull-down code PDCODE when, for example, the voltage VDIV is lower than the reference voltage VREFZQ, but the example embodiments are not limited thereto. A configuration of the first digital filter 340 may be similar to the configuration of the first digital filters 140 and 240 described above, but is not limited thereto.

The pull-up unit 350 may be connected between the power supply voltage VDDQ and the pad 310 connected with the external resistor RZQ depending on the pull-up code PUCODE. The pull-up unit 350 may include the resistors Rum and Rus and the transistors of FIG. 3, but is not limited thereto.

The second digital filter 360 may adjust or change the pull-up code PUCODE based on a comparison result of the comparator 330. In other words, the pull-up code PUCODE may be based on an output of the comparator 330. For example, the second digital filter 360 may increase or decrease the pull-up code PUCODE when the voltage VDIV is higher than the reference voltage VREFZQ, but is not limited thereto. In contrast, the second digital filter 360 may decrease or increase the pull-up code PUCODE when, for example, the voltage VDIV is lower than the reference voltage VREFZQ, but is not limited thereto. A configuration of the second digital filter 360 may be similar to the configuration of the second digital filters 160 and 260 described above, but is not limited thereto.

The controller 370 may generate a first control signal ZQPD_EN for activating the first digital filter 340. The first digital filter 340 may be activated during an interval (e.g., time period) where the first control signal ZQPD_EN is activated, and thus, the pull-down code PDCODE may be adjusted. The controller 370 may generate a second control signal ZQPU_EN for activating the second digital filter 360. The second digital filter 360 may be activated and may adjust the pull-up code PUCODE during an interval (e.g., time period) in which the second control signal ZQPU_EN is activated, following the interval in which the first control signal ZQPD_EN is activated.

Unlike the calibration circuits 100 and 200 of FIGS. 1, 2, 7, and 8, the calibration circuit 300 of FIGS. 9 and 10 may adjust the pull-up code PUCODE through a second path after adjusting the pull-down code PDCODE through a first path, but the example embodiments are not limited thereto. The calibration circuit 300 may not adjust the pull-up code PUCODE while the pull-down code PDCODE is adjusted. First, an operation in which the calibration circuit 300 adjusts the pull-down code PDCODE will be described with reference to FIG. 9.

The pull-down code PDCODE may be adjusted through the first path, but is not limited thereto. The first path may include the pull-down units 320_1 to 320_4, the pad 310, the common node, the comparator 330, and/or the first digital filter 340, etc. As in the above-described pull-up units 120_1 and 220_1 to 220_4, the pull-down units 320_1 to 320_4 may receive the pull-down code PDCODE from the first digital filter 340 while the pull-down code PDCODE is adjusted, and may be respectively connected between the pad 310 and the power supply voltage VSSQ. In contrast, as in the pull-up units 120_2 to 220_5~220_8, the pull-down units 320_5 to 320_8 may not be electrically connected between the pad 310 and the power supply voltage VSSQ, but is not limited thereto.

A level of the voltage VDIV may be determined by voltage division determined made according to a difference between the power supply voltages VDDQ and VSSQ, the pull-down units 320_1 to 320_4, and/or the external resistor RZQ, etc. The pull-down units 320_1 to 320_4 may be connected in parallel, but are not limited thereto. For example, in the case where the power supply voltage VSSQ is a ground voltage and a resistance value of each of the pull-down units 320_1 to 320_4 is "RD", the level of the voltage VDIV may be "VDDQ×[RD/4]/[RZQ+(RD/4)]". The reference voltage VREFZQ may be set in advance and/or real-time to "VDDQ×0.2" such that a resistance value of each of the pull-down units 320_1 to 320_4 is identical to a resistance value of the external resistor RZQ. As the number of pull-down units included in the first path increases, a level of the reference voltage VREFZQ may decrease. The number of pull-down units and the level of the reference voltage VREFZQ are not limited to the above-described examples. The number of pull-down units may be determined depending on a level of the reference voltage VREFZQ set in advance and/or in real-time. For example, in the case where the number of pull-down units is "M", the level of the reference voltage VREFZQ may be "VDDQ× [RZQ/(M/2)]/[RZQ/(M/2)+RZQ]". The first digital filter 340 may store the adjusted pull-down code PDCODE, that is, a final pull-down code to a register 341.

The calibration circuit 300 may adjust the pull-up code PUCODE through the second path after adjusting the pull-down code PDCODE through the first path. Referring to FIG. 10, the second path may include the pull-up unit 350, the pad 310, the common node, the comparator 330, and/or the second digital filter 360, etc. Here, while the pull-up code PUCODE is adjusted, all the pull-down units 320_1 to 320_8 may be activated, and the final pull-down code may be respectively provided to the pull-down units 320_1 to 320_8. The pull-down units 320_1 to 320_8 may be connected in parallel between the pad 310 and the power supply voltage VSSQ, and a resistance value of each of the pull-down units 320_1 to 320_8 is identical to the resistance value of the external resistor RZQ depending on the final pull-down code.

The level of the voltage VDIV may be determined by voltage division determined according to the difference between the power supply voltages VDDQ and VSSQ, the pull-down units 320_1 to 320_8, the external resistor RZQ, and/or the pull-up unit 350, etc. While the pull-up code PUCODE is adjusted through the second path, the external resistor RZQ and the pull-up unit 350 may be connected in parallel between the power supply voltage VDDQ and the pad 310. Accordingly, to adjust the resistance value of the pull-up unit 350 to the resistance value of the external resistor RZQ, while maintaining the reference voltage VREFZQ, the pull-down units 320_1 to 320_8 may also be connected in parallel. For example, a combined resistance value of the pull-down units 320_1 to 320_8 connected in parallel may be half a combined resistance value of pull-down units 320_1 to 320_4, but the example embodiments are not limited thereto.

A group of the external resistor RZQ and the pull-up unit 350, and a group of the pull-down units 320_1 to 320_8, may be connected in series between the power supply voltages VDDQ and VSSQ. For example, in the case where the power supply voltage VSSQ is a ground voltage, a resistance value of each of the pull-down units 320_1 to 320_8 is "RD", and a resistance value of the pull-up unit 350 is "RU", the level of the voltage VDIV may be "VDDQ× [RD/8]/[(RZQ||RU)+(RD/8)]", etc. Since "RD" is set to "RZQ" depending on the final pull-down code, the level of the voltage VDIV may be "VDDQ×[RZQ/8]/[(RZQ||RU)+ (RZQ/8)]". Like the case where the pull-down code PDCODE is adjusted, the reference voltage VREFZQ may be maintained at "VDDQ×0.2". The second digital filter 360 may store the adjusted pull-up code PUCODE, that is, a final pull-up code to a register 361.

Figure 11:
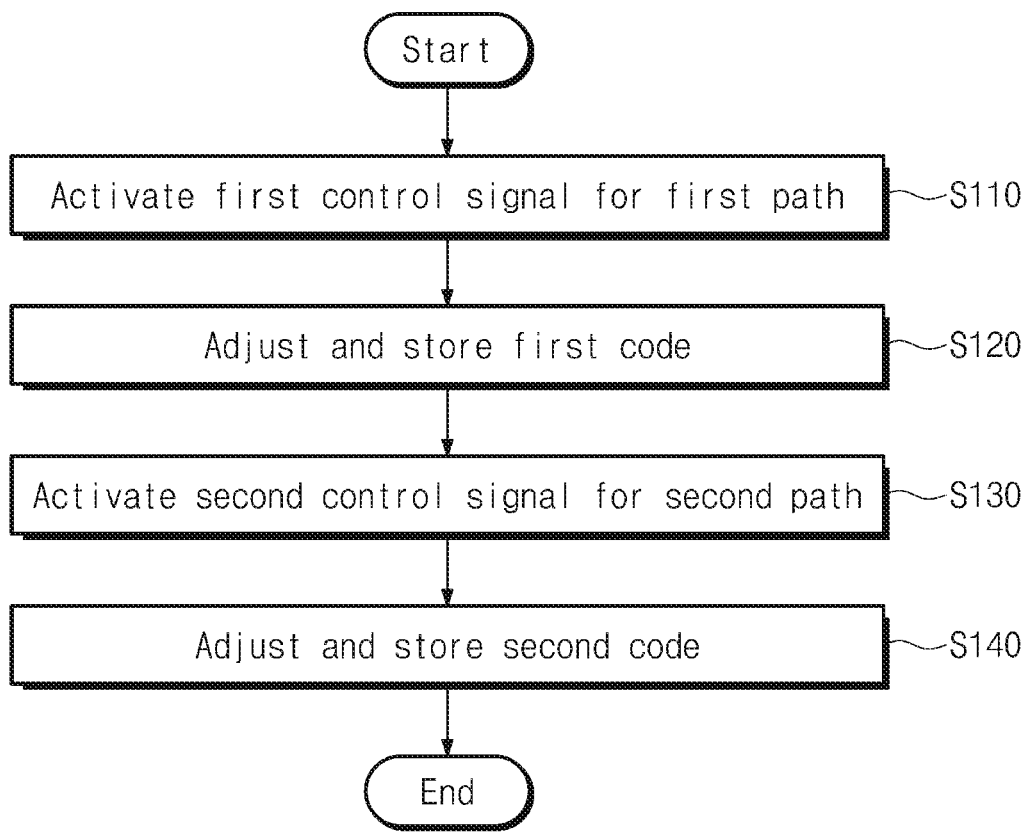
FIG. 11 is a flowchart illustrating an operation method of a calibration circuit according to at least one example embodiment of the inventive concepts.

FIG. 11 is a flowchart illustrating an operation method of a calibration circuit according to at least one example embodiment of the inventive concepts. FIG. 11 will be described with reference to FIGS. 1 to 10. Each of the calibration circuits 100 and 200 may first adjust the pull-up code PUCODE through the first path and then may adjust the pull-down code PDCODE through the second path. In contrast, the calibration circuit 300 may first adjust the pull-down code PDCODE through the first path and then may adjust the pull-up code PUCODE through the second path. That is, a calibration circuit according to at least one example embodiment of the inventive concepts may first adjust a first code through a first path and then may adjust a second code through a second path. Here, the first code may be a pull-up code PUCODE or the pull-down code PDCODE, and the second code may be a pull-down code PDCODE or the pull-up code PUCODE. Also, a first resistance unit may be a pull-up unit or a pull-down unit, and a second resistance unit may be a pull-down unit or a pull-up unit. A first resistance value of the first resistance unit may be set identically to a resistance value of the external resistor RZQ by each of the calibration circuits 100, 200, and 300, and a second resistance value of the second resistance unit may also be set identically to the resistance value of the external resistor RZQ by each of the calibration circuits 100, 200, and 300, but the example embodiments are not limited thereto.

In operation S110, the controller 170, 270, or 370 of the calibration circuit 100, 200, or 300 may activate the first control signal ZQPU_EN or ZQPD_EN for activating the first path. The first resistance unit(s), the comparator 130, 230, or 330, and the first digital filter 140, 240, or 340 included in the first path may be activated depending on (e.g., based on) the first control signal.

In operation S120, the calibration circuit 100, 200, or 300 may adjust the first code through the first path. The first digital filter 140, 240, or 340 may adjust the first code such that the first resistance value of the first resistance unit is identical to a resistance value of the external resistor RZQ. The adjusted first code may be stored to the register 141, 241, or 341 as a first final code.

In operation S130 following operation S120, the controller 170, 270, or 370 of the calibration circuit 100, 200, or 300 may activate the second control signal ZQPD_EN or ZQPU_EN for activating the second path. The first resistance units, the second resistance unit, the comparator 130, 230, or 330, and the second digital filter 160, 260, or 360 included in the second path may be activated according to the second control signal.

In operation S140, the calibration circuit 100, 200, or 300 may adjust the second code through the second path. The second digital filter 160, 260, or 360 may adjust the second code such that the second resistance value of the second resistance unit is identical to a resistance value of the external resistor RZQ. The adjusted second code may be stored to the register 161, 261, or 361 as a second final code.

Figure 12:
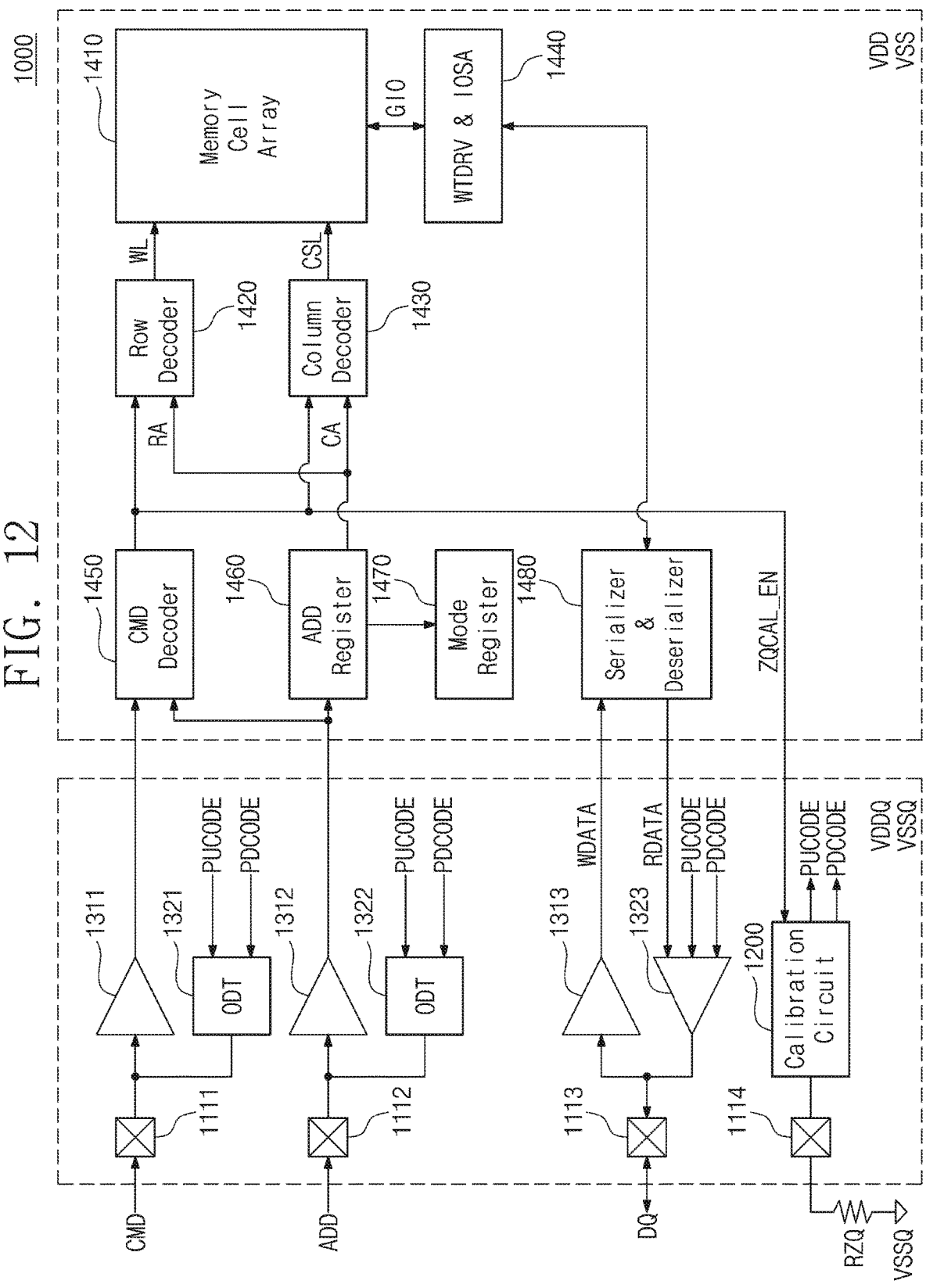
FIG. 12 is a block diagram illustrating a memory device to which a calibration circuit according to at least one example embodiment of the inventive concepts is applied.

FIG. 12 is a block diagram illustrating a memory device to which a calibration circuit according to at least one example embodiment of the inventive concepts is applied. A memory device 1000 may be also referred to as a "semiconductor memory device". The memory device 1000 may include pads 1111 to 1114, a calibration circuit 1200, input buffers 1311 to 1313, ODT circuits 1321 and 1322, an output driver 1323, a memory cell array 1410, a row decoder 1420, a column decoder 1430, a write driver and input/output sense amplifier 1440, a command decoder 1450, an address register 1460, a mode register 1470, and/or a serializer and deserializer 1480, etc., but is not limited thereto.

A command CMD may be input to the pad 1111 from the outside of the memory device 1000. The pad 1111 may be also referred to as a "terminal" or a "pin". The command CMD may be included in a unidirectional signal (e.g., CS_n, ACT_n, RAS_n, CAS_n, and WE_n, etc.) input only to the memory device 1000, and the pad 1111 may be an input pad.

An address ADD may be input to the pad 1112 from the outside of the memory device 1000. The address ADD may be included in a unidirectional signal (e.g., A0, A1, and A2, etc.) input only to the memory device 1000, and the pad 1112 may be an input pad. The memory device 1000 may receive a row address RA and a column address CA indicating a location of memory cells in the memory cell array 1410 through the pad 1112. Also, the memory device 1000 may further receive an operation code OPCODE for setting an operation mode of the memory device 1000 through the pad 1112.

Write data may be input to the pad 1113 from the outside of (e.g., an external source, etc.) the memory device 1000. Internally read data of the memory device 1000 may be output to the pad 1113. A DQ signal including the write data or the read data may be input to the memory device 1000 through the pad 1113 or may be output from the memory device 1000 through the pad 1113. The DQ signal may be a bidirectional signal, and the pad 1113 may be a data input/output pad, but the example embodiments are not limited thereto. For example, an intermediate level "[VOL+VOH]/2" of a first level VOL of a voltage corresponding to logic "0" of the DQ signal and a second level VOH of a voltage corresponding to logic "1" of the DQ signal may be identical to the level of the reference voltage VREFZQ described above, and the level of the reference voltage VREFZQ may be referred to as a "center level" of the DQ signal or a "common mode level". The reference voltage VREFZQ may be determined in advance in compliance with the protocol of the memory device 1000. For example, in the case where a center tap termination (CTT) scheme is used to transmit the DQ signal, a level of the reference voltage VREFZQ may be "VDDQ×0.5", but is not limited thereto. For another example, in the case where a pseudo open drain (POD) termination scheme is used to transmit the DQ signal, a level of the reference voltage VREFZQ may be "VDDQ×0.8", etc. For another example, in the case where a ground termination scheme is used to transmit the DQ signal, a level of the reference voltage VREFZQ may be "VDDQ×0.2", etc. The level of the reference voltage VREFZQ is not limited to the above-described examples.

The external resistor RZQ described with reference to FIGS. 1, 2, 7, 8, 9, and 10 may be connected to the pad 1114. For example, the pad 1114 may be referred to as a "ZQ pad", and may be the above-described pad 110, 210, or 310. An example is illustrated in FIG. 12 as the external resistor RZQ is connected between the pad 1114 and the power supply voltage VSSQ (refer to FIGS. 1, 2, 7, and 8), but the external resistor RZQ may be connected between the pad 1114 and the power supply voltage VDDQ (refer to FIGS. 9 and 10), but is not limited thereto.

The calibration circuit 1200 may be the calibration circuit 100, 200, or 300 described with reference to FIGS. 1, 2, 7, 8, 9, and 10, but is not limited thereto. The calibration circuit 1200 may generate the pull-up code PUCODE and the pull-down code PDCODE by using the external resistor RZQ.

The input buffer 1311 may receive the command CMD through the pad 1111 and may provide the command CMD to the command decoder 1450. The input buffer 1312 may receive the address ADD through the pad 1112 and may provide the address ADD to the address register 1460. Unlike the illustration, the input buffer 1312 may receive a command/address CA through the pad 1112 and may provide the command/address CA to the command decoder 1450 and the address register 1460, but is not limited thereto. The input buffer 1313 may receive the write data through the pad 1113 and may provide the write data to the serializer and deserializer 1480, etc.

The ODT circuit 1321 may provide a termination resistor connected to the pad 1111 depending on the pull-up code PUCODE and the pull-down code PDCODE. The ODT circuit 1321 may provide a termination resistor to an end of a transmission line used to transmit the command CMD from a memory controller (not illustrated) to the memory device 1000.

The ODT circuit 1322 may provide a termination resistor connected to the pad 1112 depending on and/or based on the pull-up code PUCODE and the pull-down code PDCODE. The ODT circuit 1322 may provide a termination resistor to an end of a transmission line used to transmit the address ADD from the memory controller to the memory device 1000, but is not limited thereto.

The output driver 1323 may receive the read data from the serializer and deserializer 1480, and may output the read data to the memory controller through the pad 1113, but is not limited thereto. Also, the output driver 1323 may receive the pull-up code PUCODE and the pull-down code PDCODE. The output driver 1323 may provide a termination resistor connected to the pad 1113 depending on the pull-up code PUCODE and the pull-down code PDCODE. The output driver 1323 may provide a termination resistor to an end of a transmission line used to transmit a data input/output signal (DQ signal) between the memory controller and the memory device 1000, but is not limited thereto.

In the case where the pull-up code PUCODE and the pull-down code PDCODE are not provided to the ODT circuits 1321 and 1322, and the output driver 1323, the termination resistors to be provided by the ODT circuits 1321 and 1322 and the output driver 1323 may have an influence on the PVT variation. The calibration circuit 1200 may generate the pull-up code PUCODE and the pull-down code PDCODE such that the termination resistors provided by the ODT circuits 1321 and 1322 and the output driver 1323 are determined according to the external resistor RZQ without having an influence on the PVT variation.

In at least one example embodiment, the number of pads 1111 for receiving the command CMD may be at least one or more. The memory device 1000 may include pads for receiving the command CMD, input buffers respectively connected to the pads, and/or ODT circuits, but is not limited thereto. As in the above description, the number of pads 1112 for receiving the address ADD may be at least one or more. The memory device 1000 may include pads for receiving the address ADD, input buffers respectively connected to the pads, and/or ODT circuits, but is not limited thereto. Also, the memory device 1000 may include pads for receiving both the command CMD and the address ADD, input buffers respectively connected to the pads, and/or ODT circuits, but is not limited thereto. As in the above description, the number of pads 1113 may be at least one or more. The memory device 1000 may include pads for data input/output and input buffers and output buffers connected to the pads.

The memory cell array 1410 may include memory cells connected to word lines WL and bit lines. The word lines WL and the bit lines may be arranged to be perpendicular to each other. For example, a memory cell may be a dynamic random access memory (DRAM) cell, a static random access memory (SRAM) cell, a thyristor random access memory (TRAM) cell, a NAND flash memory cell, a NOR flash memory cell, a resistive random access memory (RRAM) cell, a ferroelectric random access memory (FRAM) cell, a phase change random access memory (PRAM) cell, and/or a magnetic random access memory (MRAM) cell, etc. For example, the memory cell array 1410 may include the DRAM cells, and the memory device 1000 may be a double data rate synchronous DRAM (DDR SDRAM), DDR2 SDRAM, DDR3 SDRAM, DDR4 SDRAM, DDR5 SDRAM, a low power double data rate (LPDDR) SDRAM, LPDDR2 SDRAM, LPDDR3 SDRAM, LPDDR4 SDRAM, LPDDR5 SDRAM, a high bandwidth memory (HBM), HBM2, HBM3, etc. Data received through the pad 1113 may be stored to the memory cell array 1410. Data stored in the memory cell array 1410 may be output through the pad 1113.

The row decoder 1420 may decode the row address RA and may select at least one of the word lines WL. For example, when an activate command, a refresh command, etc. is input to the memory device 1000, the row decoder 1420 may select at least one of the word lines WL. When a precharge command is input to the memory device 1000, the row decoder 1420 may precharge a selected word line(s).

The column decoder 1430 may decode the column address CA and may select at least one of column selection lines CSL. One column selection line may be connected with at least two or more bit lines (e.g., 8 bit lines). The number of bit lines connected to one column selection line may be determined based on a prefetch size, a burst length, etc. For example, when a read command, a write command, etc. is input to the memory device 1000, the column decoder 1430 may select at least one of the column selection lines CSL. For convenience of illustration, the column selection lines CSL and the word lines WL are illustrated in FIG. 12 as being parallel to each other, but the column selection lines CSL may be arranged to be perpendicular to the word lines WL.

The write driver and input/output sense amplifier 1440 may receive write data from the serializer and deserializer 1480, and may write the write data to memory cells selected by the row decoder 1420 and the column decoder 1430 through global input/output lines GIO, but is not limited thereto. The write driver and input/output sense amplifier 1440 may read data from selected memory cells through the global input/output lines GIO and may provide the read data to the serializer and deserializer 1480, but is not limited thereto.

The command decoder 1450 may receive and decode the command CMD from the input buffers 1311 and 1312. For example, the command decoder 1450 may decode the active command, the precharge command, and/or the refresh command and may control the row decoder 1420 based on the decoded command(s). For example, the command decoder 1450 may decode the write command or the read command and may control the column decoder 1430, etc. Additionally, the command decoder 1450 may decode a mode register set (MRS) command and may control the address register 1460 such that the operation code OPCODE is stored to the mode register 1470, etc.

As another example, the command decoder 1450 may decode the ZQ calibration command and may provide the control signal ZQCAL_EN to the calibration circuit 1200. For example, the ZQ calibration command may be generated by the memory controller for impedance matching of the memory device 1000. The calibration circuit 1200 may start a ZQ calibration operation when the control signal ZQCAL_ENB is activated. The ZQ calibration operation may indicate an operation of adjusting the pull-up code PUCODE and the pull-down code PDCODE and may be referred to as an "impedance calibration operation".

The address register 1460 may receive and temporarily store the address ADD from the input buffer 1312. The address register 1460 may provide the row address RA to the row decoder 1420 under the control of the command decoder 1450. The address register 1460 may provide the column address CA to the column decoder 1430 under the control of the command decoder 1450. The address register 1460 may provide the operation code OPCODE to the mode register 1470 under the control of the command decoder 1450.

The mode register 1470 may store operation codes or values for setting an operation mode of the memory device 1000, but is not limited thereto. For example, the mode register 1470 may store an operation code for setting a value of a termination resistor provided to each of the pads 1111, 1112, and 1113. For example, a value of a termination resistor according to an operation code may be set to any one of RZQ/1, RZQ/2, RZQ/3, . . . , RZQ/K (here, K being a natural number).

The serializer and deserializer 1480 may receive write data from the input buffer 1313 and may deserialize bits of write data. The serializer and deserializer 1480 may provide the write data including the deserialized bits to the write driver and/or input/output sense amplifier 1440. The serializer and deserializer 1480 may receive read data from the write driver and/or input/output sense amplifier 1440 and may serialize bits of the read data. The serializer and deserializer 1480 may provide the read data including the serialized bits to the output driver 1323.

In at least one example embodiment, the memory cell array 1410, the row decoder 1420, the column decoder 1430, the write driver and input/output sense amplifier 1440, the command decoder 1450, the address register 1460, the mode register 1470, and/or the serializer and deserializer 1480, etc., may operate based on power supply voltages VDD and VSS. In contrast, circuits connected with the pads 1111 to 1114 may operate based on the power supply voltages VDDQ and VSSQ, not the power supply voltages VDD and VSS. For example, the calibration circuit 1200, the input buffers 1311 to 1313, the ODT circuits 1321 and 1322, and/or the output driver 1323, etc., may operate based on the power supply voltages VDDQ and VSSQ. Circuits operating based on the power supply voltages VDDQ and VSSQ may be independent of the power supply voltages VDD and VSS, and may have no influence on a noise generated by and/or corresponding to the power supply voltages VDD and VSS. Of course, unlike the illustration of FIG. 12, the circuits connected with the pads 1111 to 1114 may operate based on the power supply voltages VDD and VSS.

Figure 13:
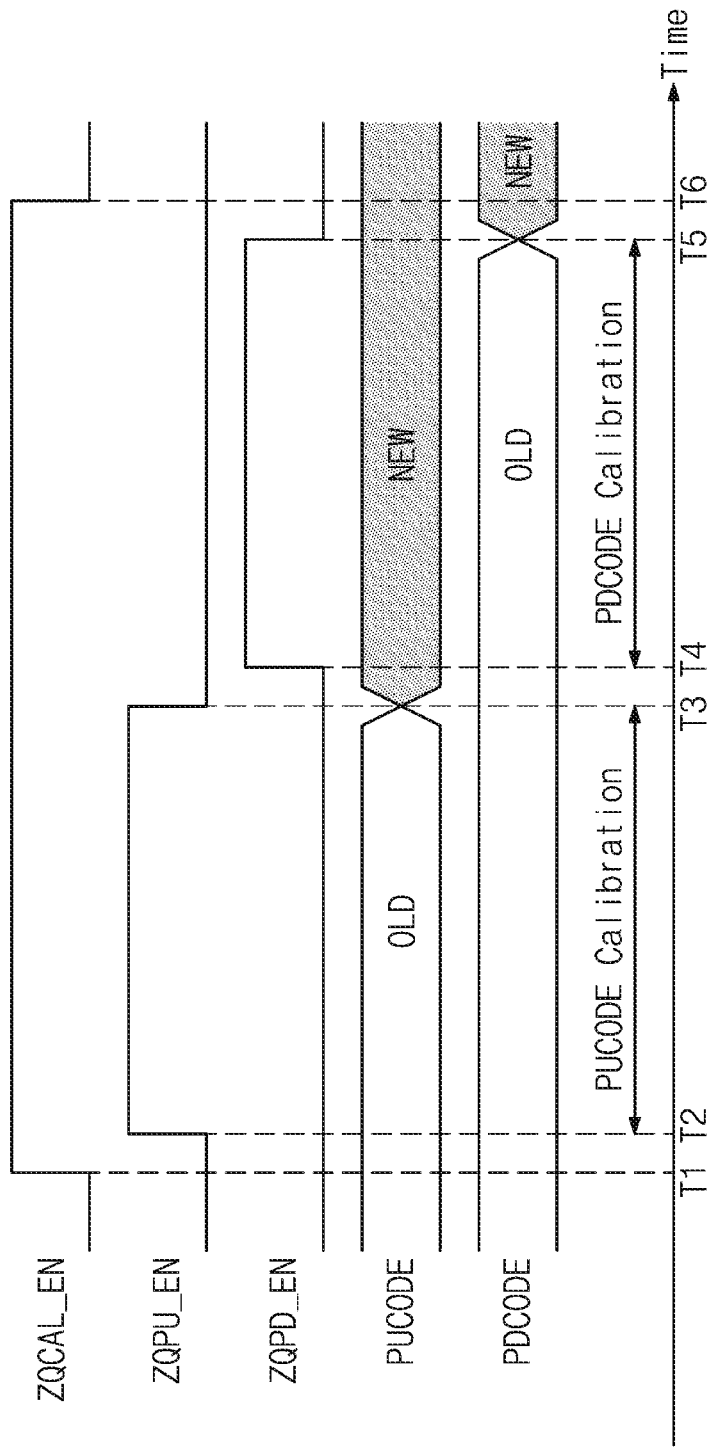
FIG. 13 is a timing diagram of a calibration circuit in the case where a ZQ calibration code is input to a memory device of FIG. 12 according to at least one example embodiment.

FIG. 13 is a timing diagram of a calibration circuit in the case where a ZQ calibration code is input to a memory device of FIG. 12 according to at least one example embodiment. FIG. 13 will be described with reference to FIG. 12, but is not limited thereto. In the case where the ZQ calibration command is input to the memory device 1000, at a time T1, the command decoder 1450 may activate the control signal ZQCAL_EN, but the example embodiments are not limited thereto.

At a time T2, a controller (refer to the controllers 170 and 270 of FIGS. 1, 2, 7, and 8) of the calibration circuit 1200 may activate the first control signal ZQPU_EN. The calibration circuit 1200 may adjust or calibrate the pull-up code PUCODE from the time T2.

At a time T3, the controller of the calibration circuit 1200 may deactivate the first control signal ZQPU_EN. At the time T3, a new pull-up code adjusted through the calibration operation, that is, the final pull-up code may be stored to the register (refer to the registers 141 and 241 of FIGS. 1, 2, 7, and 8). The controller may deactivate the first control signal ZQPU_EN when the final pull-up code is stored to the register, but is not limited thereto. Additionally, the controller may deactivate the first control signal ZQPU_EN when a desired and/or preset time elapses from the time T2.

At a time T4, the controller of the calibration circuit 1200 may activate the second control signal ZQPD_EN. The calibration circuit 1200 may adjust or calibrate the pull-down code PDCODE from the time T4.

At a time T5, the controller of the calibration circuit 1200 may deactivate the second control signal ZQPD_EN. At the time T5, a new pull-down code adjusted through the calibration operation, that is, the final pull-down code may be stored to the register (refer to the registers 161 and 261 of FIGS. 1, 2, 7, and 8). The controller may deactivate the second control signal ZQPD_EN when the final pull-down code is stored to the register, but is not limited thereto. Additionally, the controller may deactivate the second control signal ZQPD_EN when a desired and/or preset time elapses from the time T4.

At a time T6, the command decoder 1450 may deactivate the control signal ZQCAL_EN. For example, the calibration circuit 1200 may complete the ZQ calibration operation within a desired and/or preset time corresponding to a time interval from the time T1 to the time T6.

Figure 14:
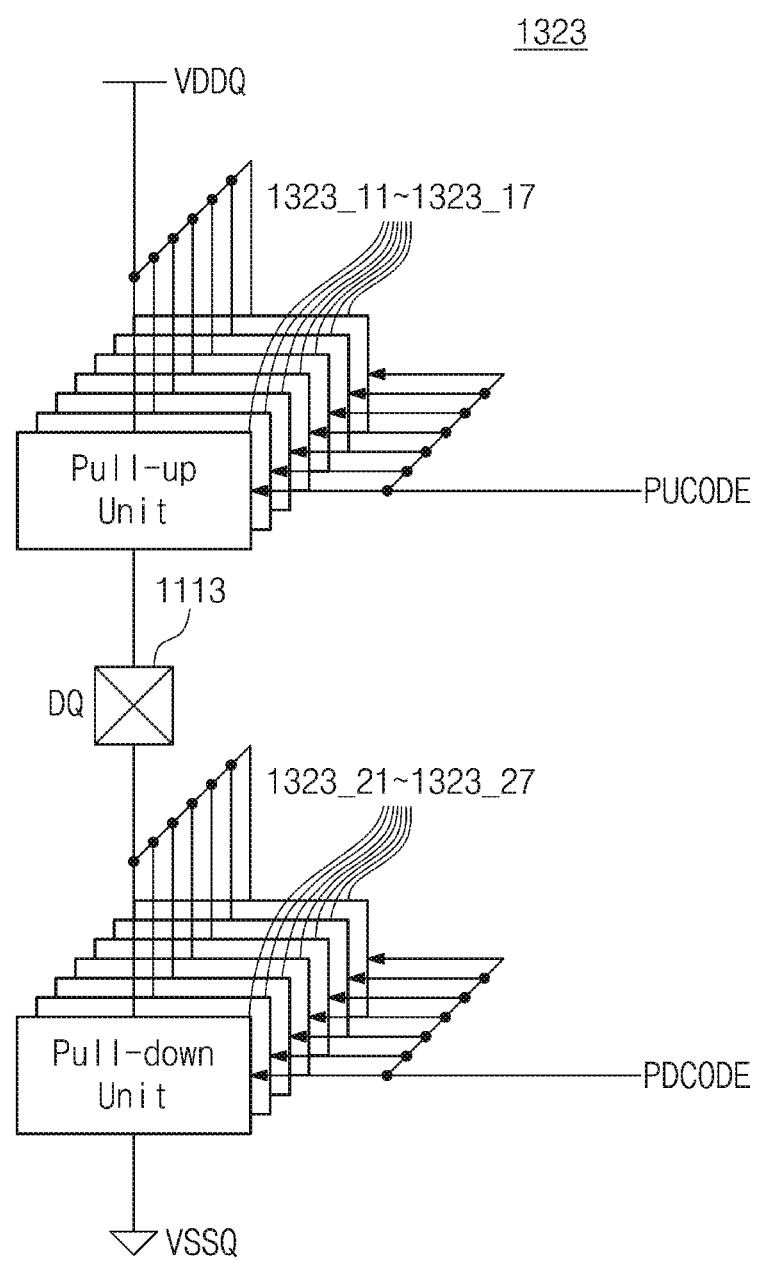
FIG. 14 is a block diagram illustrating an output driver of FIG. 12 according to at least one example embodiment.

FIG. 14 is a block diagram illustrating an output driver of FIG. 12 according to at least one example embodiment. FIG. 14 will be described with reference to FIG. 12, but is not limited thereto. The output driver 1323 may include pull-up units 1323_11 to 1323_17 connected between the power supply voltage VDDQ and/or the pad 1113, etc., but is not limited thereto. The output driver 1323 may include pull-down units 1323_21 to 1323_27 connected between the pad 1113 and/or the power supply voltage VSSQ, but is not limited thereto.

The pull-up code PUCODE generated by the calibration circuit 1200 may be provided to the pull-up units 1323_11 to 1323_17, respectively. A resistance value of each of the pull-up units 1323_11 to 1323_17 depending on the pull-up code PUCODE may be identical to a resistance value of the external resistor RZQ. A configuration of each of the pull-up units 1323_11 to 1323_17 may be identical to the configuration of the above-described pull-up unit 120_1, 120_2, 220_i (i being one of 1 to 8), or 350.

The pull-down code PDCODE generated by the calibration circuit 1200 may be provided to the pull-down units 1323_21 to 1323_27, respectively. A resistance value of each of the pull-down units 1323_21 to 1323_27 depending on the pull-down code PDCODE may be identical to the resistance value of the external resistor RZQ. A configuration of each of the pull-down units 1323_21 to 1323_27 may be identical to the configuration of the above-described pull-down unit 150_1, 250, or 320_i (i being one of 1 to 8).

In at least one example embodiment, the number of pull-up units, which are electrically connected between the power supply voltage VDDQ and the pad 1113, from among the pull-up units 1323_11 to 1323_17 may be determined depending on an operation code which is stored in the mode register 1470 for adjusting a termination resistance value of the pad 1113. The number of pull-down units, which are electrically connected between the pad 1113 and the power supply voltage VSSQ, from among the pull-down units 1323_21 to 1323_27 may be determined depending on an operation code stored in the mode register 1470. A termination resistance value may decrease as the number of pull-up units electrically connected between the power supply voltage VDDQ and the pad 1113 and the number of pull-down units electrically connected between the pad 1113 and the power supply voltage VSSQ increase. Accordingly, the number of pull-up units 1323_11 to 1323_17 and the number of pull-down units 1323_21 to 1323_27 are not limited to illustration of FIG. 14, and may be "K" described with reference to FIG. 12.

A calibration circuit according to at least one example embodiment of the inventive concepts may adjust both a pull-up code and a pull-down code by using a common node shared by a pull-up calibration path and a pull-down calibration path and one comparator connected to the common node. Accordingly, the PVT variation of the calibration circuit may be improved, and a rank margin tool (RMT) of a semiconductor memory device including the calibration circuit may be improved.

While some example embodiments of the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A calibration circuit comprising:
   first and second pull-up units connected between a pad connected with an external resistor and a first power supply voltage, the first and second pull-up units each configured to receive a pull-up code;
   a pull-down unit connected between the pad and a second power supply voltage and configured to receive a pull-down code;
   a comparator configured to,
      compare a first voltage and a reference voltage to generate a first comparison result, and
      compare a second voltage and the reference voltage to generate a second comparison result,
      the first voltage generated based on the first pull-up unit and the external resistor, the first voltage generated at a common node connected to the pad, and the second voltage generated based on the first and second pull-up units, the external resistor, and the pull-down unit, the second voltage generated at the common node;
   a first digital filter configured to adjust the pull-up code based on the first comparison result; and
   a second digital filter configured to adjust the pull-down code based on the second comparison result.

2. The calibration circuit of claim 1, wherein the first digital filter is configured to adjust the pull-up code such that a resistance value of the first pull-up unit is identical to a resistance value of the external resistor,
   wherein, after the pull-up code is adjusted, the second digital filter is configured to adjust the pull-down code such that a resistance value of the pull-down unit is identical to the resistance value of the external resistor, and
   wherein the first and second digital filters share the comparator comparing each of the first and second voltages of the common node with the reference voltage.

3. The calibration circuit of claim 2, wherein
   the first voltage is generated based on the resistance value of the external resistor connected between the second power supply voltage and the pad; and
   the resistance value of the first pull-up unit is changed based on the pull-up code.

4. The calibration circuit of claim 3, wherein the first digital filter is configured to adjust the pull-up code such that a level of the first voltage is identical to a level of the reference voltage.

5. The calibration circuit of claim 2, wherein
   in response to the first digital filter adjusting the pull-up code, the second pull-up unit is configured to be electrically opened between the pad and the first power supply voltage; and
   in response to the second digital filter adjusting the pull-down code, the first and second pull-up units are configured to be connected between the pad and the first power supply voltage.

6. The calibration circuit of claim 5, wherein the second voltage is determined based on the resistance value of the external resistor, resistance values of the first and second pull-up units, and the resistance value of the pull-down unit.

7. The calibration circuit of claim 6, wherein the second digital filter is configured to adjust the pull-down code such that a level of the second voltage is identical to a level of the reference voltage.

8. The calibration circuit of claim 6, wherein
   the first and second pull-up units are connected in parallel between the pad and the first power supply voltage; and
   the external resistor and the pull-down unit are connected in parallel between the pad and the second power supply voltage.

9. A semiconductor memory device comprising:
   a calibration circuit configured to,
      adjust a first code, the adjusted first code causing a first resistance value of each of a plurality of first resistance units connected between a first pad and a first power supply voltage to be identical to a resistance value of an external resistor connected to the first pad,
      adjust a second code, the adjusted second code causing a second resistance value of a second resistance unit connected between the first pad and a second power supply voltage to be identical to the resistance value of the external resistor,
      generate a first result by comparing a first voltage and a reference voltage,
      generate a second result by comparing a second voltage and the reference voltage,
      the first voltage generated at a common node connected to the first pad based on one of the first resistance units and the external resistor, and
      the second voltage generated at the common node based on the first resistance units, the second resistance unit, and the external resistor;
   a memory cell array including dynamic random access memory (DRAM) cells connected to word lines and bit lines and configured to store data received or to be output through a second pad;
   a row decoder configured to select at least one of the word lines;
   a column decoder configured to select at least one of column selection lines connected with the bit lines; and
   an output driver configured to,
      receive the first code and the second code,
      provide a termination resistance to the second pad based on the first code and the second code, and
      output the data stored in the memory cell array through the second pad.

10. The semiconductor memory device of claim 9, wherein the calibration circuit is configured to:
    not adjust the second code while adjusting the first code; and
    adjust the second code after adjusting the first code.

11. The semiconductor memory device of claim 10, wherein the calibration circuit is further configured to:

generate a first control signal to be activated during a first time interval and a second control signal to be activated during a second time interval following the first time interval.

12. The semiconductor memory device of claim 11, wherein the calibration circuit further includes:
a first digital filter configured to be activated by the first control signal, and adjust the first code based on the first result; and
a second digital filter configured to be activated by the second control signal, and adjust the second code based on the second result.

13. The semiconductor memory device of claim 11, wherein a second first resistance unit of the plurality of first resistance units is only activated using the second control signal.

14. The semiconductor memory device of claim 9, wherein the output driver comprises:
an on-die termination (ODT) circuit configured to receive the first code and the second code, and provide a termination resistance to a third pad; and
a command decoder configured to decode a ZQ command activating the calibration circuit, a write command associated with the data, or a read command associated with the data, the ZQ command, the write command, or the read command received through the third pad.

15. The semiconductor memory device of claim 14, wherein the output driver comprises:
a mode register configured to store operation codes based on a mode register set command,
wherein the command decoder is further configured to decode the mode register set command.

16. The semiconductor memory device of claim 15, wherein the output driver is configured to set a value of a termination resistor connected to the second pad based on the operation codes.

17. A semiconductor memory device comprising:
a calibration circuit configured to,
operate based on a first power supply voltage and a second power supply voltage,
adjust a first code and a second code using a resistance value of an external resistor connected to a first pad of the semiconductor memory device,
generate a first result by comparing a first voltage and a reference voltage, the first voltage at a common node of the semiconductor memory device based on a first resistance value, the first resistance value based on the first code and the resistance value of the external resistor, the common node connected to the first pad, and
generate a second result by comparing a second voltage and the reference voltage, the second voltage at the common node based on a second resistance value, the second resistance value based on the first code, the resistance value of the external resistor, and a third resistance value based on the second code;
an output driver configured to operate based on the first and second power supply voltages, receive the first and second codes, and adjust a value of a termination resistor connected to a second pad based on the first and second codes;
a memory cell array including dynamic random access memory (DRAM) cells connected to word lines and bit lines, the memory cell array configured to operate based on a third power supply voltage and a fourth power supply voltage, and store data received or data to be output through the second pad;
a row decoder configured to select at least one of the word lines; and
a column decoder configured to select at least one of column selection lines connected with the bit lines.

18. The semiconductor memory device of claim 17, wherein the common node is electrically connected with the first pad.

19. The semiconductor memory device of claim 17, wherein the calibration circuit is configured to:
adjust the first code based on the first result; and
adjust the second code based on the second result.

20. The semiconductor memory device of claim 17, wherein the second resistance value is half the first resistance value.

* * * * *